United States Patent
Carey et al.

(10) Patent No.: US 6,757,144 B2
(45) Date of Patent: Jun. 29, 2004

(54) FLUX GUIDE READ HEAD WITH IN STACK BIASED CURRENT PERPENDICULAR TO THE PLANES (CPP) SENSOR

(75) Inventors: Kashmira J. Carey, San Jose, CA (US); Robert Edward Fontana, Jr., San Jose, CA (US); Kuok San Ho, Cupertino, CA (US); Tao Pan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 10/054,530

(22) Filed: Jan. 18, 2002

(65) Prior Publication Data

US 2003/0137781 A1 Jul. 24, 2003

(51) Int. Cl.[7] .................................................. G11B 5/39
(52) U.S. Cl. ..................................... 360/324.2; 360/321
(58) Field of Search ........................ 360/324.2, 324.12, 360/324.1, 324.11, 321; 29/603.14–603.18

(56) References Cited

U.S. PATENT DOCUMENTS

| | | | | |
|---|---|---|---|---|
| 5,712,565 A | 1/1998 | Schultz et al. | ............... | 324/252 |
| 5,712,612 A | 1/1998 | Lee et al. | ................ | 338/32 R |
| 5,729,410 A | 3/1998 | Fontana, Jr. et al. | ........ | 360/113 |
| 5,739,987 A | 4/1998 | Yuan et al. | ................. | 360/113 |
| 5,764,445 A | 6/1998 | Torng et al. | ................ | 360/113 |
| 5,780,176 A | 7/1998 | Iwasaki et al. | ............ | 428/692 |
| 5,867,889 A | 2/1999 | Dovek et al. | ............ | 29/603.13 |
| 5,898,547 A | 4/1999 | Fontana, Jr. et al. | ........ | 360/113 |
| 5,901,018 A | 5/1999 | Fontana, Jr. et al. | ........ | 360/104 |
| 5,909,344 A | 6/1999 | Gill | ............................. | 360/113 |
| 5,910,344 A | 6/1999 | Hasegawa et al. | ......... | 427/599 |
| 5,946,167 A | 8/1999 | Hara et al. | .................. | 360/113 |
| 5,949,623 A | 9/1999 | Lin | ............................. | 360/113 |
| 5,966,012 A | 10/1999 | Parkin | ........................ | 324/252 |
| 5,993,566 A | 11/1999 | Lin | ............................. | 148/108 |
| 5,995,339 A | 11/1999 | Koshikawa et al. | ........ | 360/113 |
| 6,005,753 A | 12/1999 | Fontana, Jr. et al. | ........ | 360/113 |
| 6,023,395 A | 2/2000 | Dill et al. | .................... | 360/113 |
| 6,030,753 A | 2/2000 | Lin | ............................. | 430/314 |
| 6,033,491 A | 3/2000 | Lin | ............................. | 148/108 |
| 6,052,261 A | 4/2000 | Watanabe et al. | .......... | 360/113 |
| 6,052,263 A | 4/2000 | Gill | ............................. | 360/113 |
| 6,438,026 B2 * | 8/2002 | Gillies et al. | ............... | 365/158 |
| 6,597,546 B2 * | 7/2003 | Gill | ............................. | 360/321 |
| 6,636,391 B2 * | 10/2003 | Watanabe et al. | .......... | 360/321 |
| 2002/0135949 A1 * | 9/2002 | Gill | ......................... | 360/324.2 |
| 2002/0154452 A1 * | 10/2002 | Gill | ............................ | 360/321 |
| 2003/0035249 A1 * | 2/2003 | Ho et al. | .................... | 360/321 |
| 2003/0137780 A1 * | 7/2003 | Fontana et al. | .......... | 360/324.2 |

FOREIGN PATENT DOCUMENTS

| | | | | |
|---|---|---|---|---|
| JP | 2001291214 A | * 10/2001 | ............ | G11B/5/39 |
| JP | 2001338410 A | * 12/2001 | ............ | G11B/5/39 |

* cited by examiner

*Primary Examiner*—William Klimowicz
(74) *Attorney, Agent, or Firm*—Ervin F. Johnston

(57) ABSTRACT

Various embodiments of a read head employ a bias stack which is in a sensor stack of the read head. The bias stack includes a biasing layer and is separated from a free layer in the sensor by a spacer layer. A magnetic moment of the free layer is longitudinally biased antiparallel to a magnetic moment of the biasing layer because of the coupling therebetween. The free layer is therefore more uniformly longitudinally biased than when hard bias layers are employed at first and second side surfaces of the sensor. Various methods are described for making the various read heads of the present invention.

25 Claims, 20 Drawing Sheets

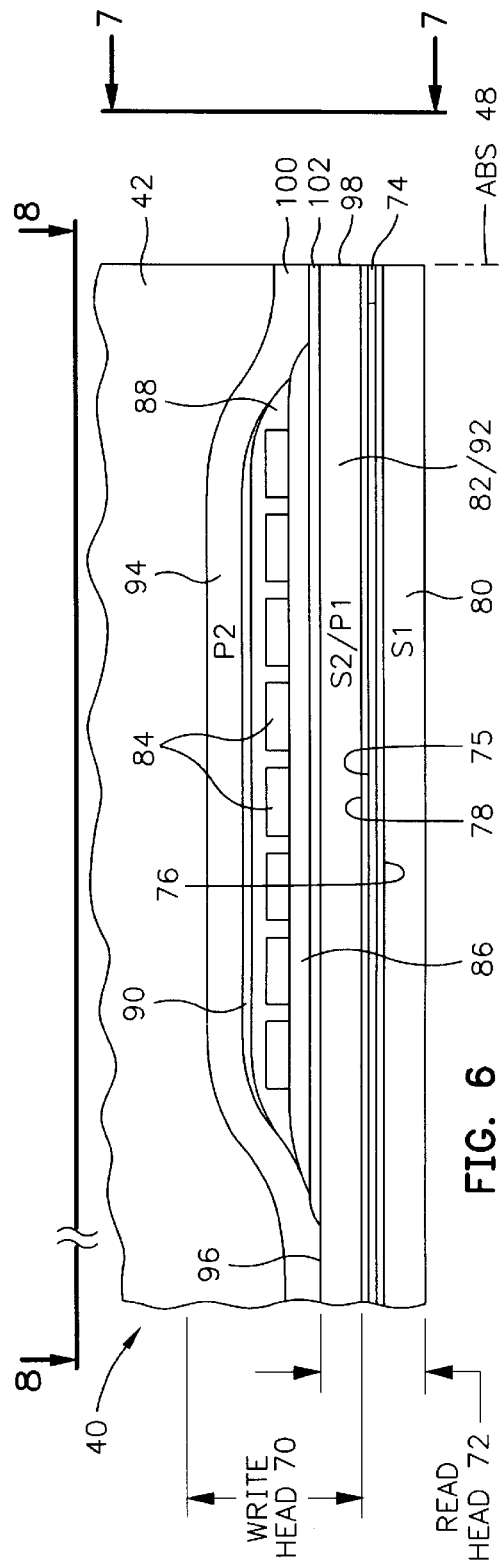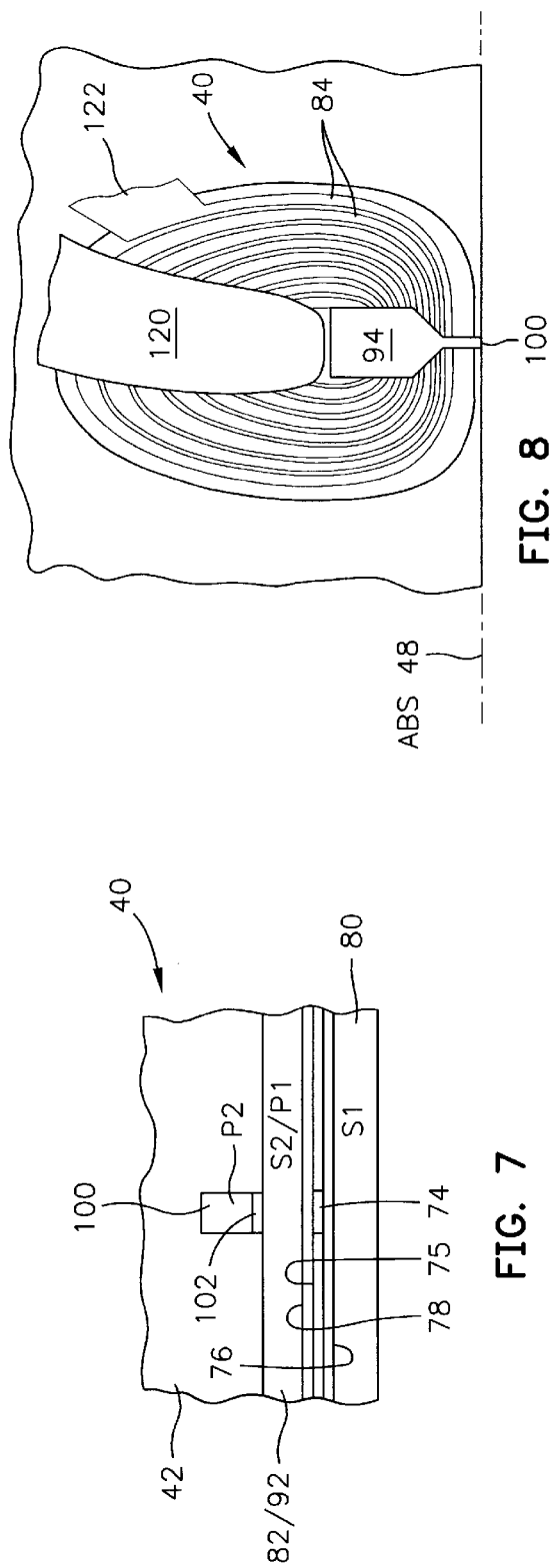
FIG. 6
FIG. 7
FIG. 8

FIG. 20  IM AND BACKFILL
REMOVE 3RD MASK
DEPOSIT L2
DEPOSIT S2

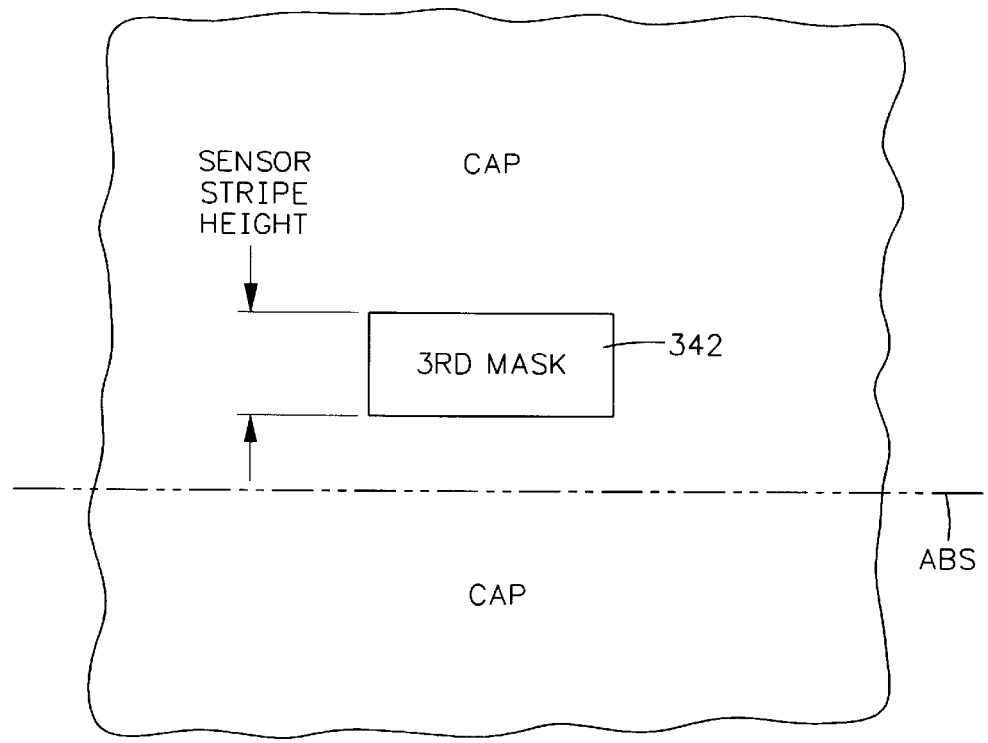
FIG. 29
```
ION MILL TO (F)
BACK FILL WITH ALUMINA
REMOVE 3RD MASK
DEPOSIT L2/S2
```
FIG. 30
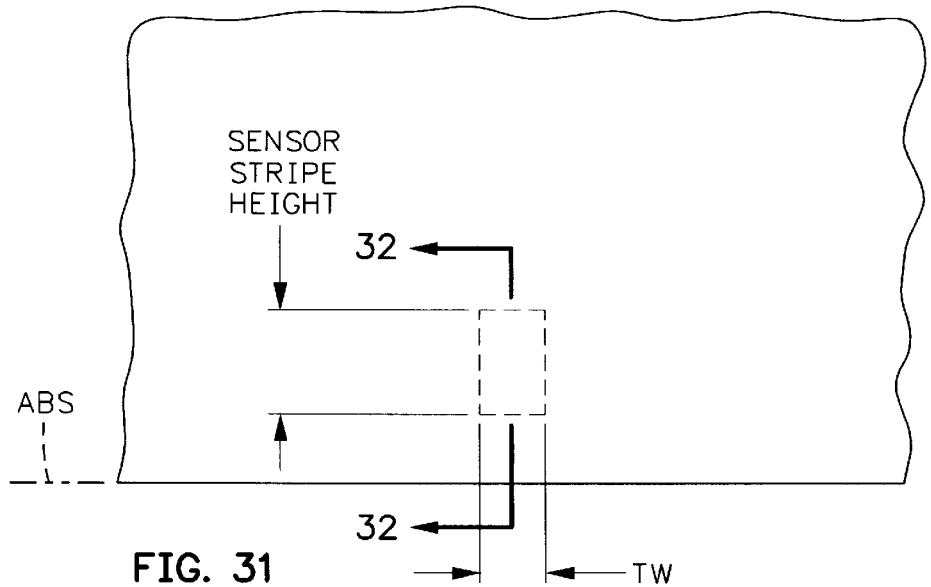
FIG. 31

FLUX GUIDE READ HEAD WITH IN STACK BIASED CURRENT PERPENDICULAR TO THE PLANES (CPP) SENSOR

BACKGROUND OF THE INVENTION

1. Field of the Invention

The present invention relates to a flux guide read head with an in stack biased CPP sensor and, more particularly, to such a sensor wherein a bias stack is located in the sensor stack for longitudinally biasing a free layer of the sensor.

2. Description of the Related Art

The heart of a computer is a magnetic disk drive which includes a rotating magnetic disk, a slider that has read and write heads, a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic field signals from the rotating disk. The read and write heads are connected to processing circuitry that operates according to a computer program to implement the writing and reading functions.

An exemplary high performance read head employs a tunnel junction sensor for sensing the magnetic field signals from the rotating magnetic disk. The sensor includes a tunneling barrier layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) wherein the ABS is an exposed surface of the sensor that faces the rotating disk. The tunnel junction sensor is located between ferromagnetic first and second shield layers. First and second leads, which may be the first and second shield layers or first and second lead layers, are connected to the tunnel junction sensor for conducting a tunneling current therethrough. The tunneling current is conducted perpendicular to the major thin film planes (CPP) of the sensor as contrasted to a spin valve sensor where a sense current is conducted in (parallel to) the major thin film planes (CIP) of the spin valve sensor. In addition, a spin valve sensor can be set up in a CPP geometry where the current is conducted perpendicular to the plane. Although the description here is for the tunnel junction sensor, the art of the invention can be applied to CPP spin valve sensors. A magnetic moment of the free layer is free to rotate upwardly and downwardly with respect to the ABS from a quiescent or zero bias point position in response to positive and negative magnetic field signals from the rotating magnetic disk. The quiescent position of the magnetic moment of the free layer, which is parallel to the ABS, is when the tunneling current is conducted through the sensor without magnetic field signals from the rotating magnetic disk. The sensitivity of the tunnel junction sensor is quantified as magnetoresistive coefficient dr/R where dr is the change in resistance of the tunnel junction sensor from minimum resistance to maximum resistance and R is the resistance of the tunnel junction sensor at minimum resistance.

The first and second shield layers or first and second lead layers may engage the bottom and the top respectively of the tunnel junction sensor so that the first and second lead layers and/or the first and second shield layers conduct the biasing current through the tunnel junction sensor perpendicular to the major planes of the layers of the tunnel junction sensor. The tunnel junction sensor has first and second side surfaces which are normal to the ABS. The prior art has the first and second hard bias layers abut the first and second side surfaces respectively of the tunnel junction sensor for longitudinally biasing the magnetic domains of the free layer. This longitudinal biasing magnetically stabilizes the free layer and maintains the magnetic moment of the free layer parallel to the ABS when the read head is in the quiescent condition. In our invention, the longitudinal bias field is provided by an in-stack bias stack.

Magnetic head assemblies, wherein each magnetic head assembly includes a read head and a write head combination, are constructed in rows and columns on a wafer. After completion at the wafer level, the wafer is diced into rows of magnetic head assemblies and each row is lapped by a grinding process to lap the row to a predetermined air bearing surface (ABS). In a typical tunnel junction read head all of the layers of the read head are exposed at the ABS, namely first edges of each of the first shield layer, the free layer, the barrier layer, the pinned layer, the pinning layer and the second shield layer. Opposite edges of these layers are recessed in the head. The barrier layer is a thin layer, on the order of 5 Å–30 Å, which places the free and pinned layers very close to one another at the ABS. When a row of magnetic head assemblies is lapped there is a high risk of magnetic material from the free and pinned layers being smeared across the ABS to cause a short therebetween. Accordingly, there is a strong-felt need to construct magnetic head assemblies with tunnel junction heads without the risk of shorting between the free and pinned layers at the ABS due to lapping.

A scheme for preventing shorts across the barrier layer of the tunnel junction sensor is to recess the tunnel junction sensor within the head and provide a flux guide between the ABS and the sensor for guiding flux signals from the rotating magnetic disk. Typically, the ferromagnetic material of the flux guide is required to be stabilized by hard bias layers on each side of the flux guide. With submicron track widths, such as 0.1 $\mu$m to 0.2 $\mu$m, the hard biasing of the flux guide renders the magnetization of the flux guide too stiff to adequately respond to flux signals from the rotating magnetic disk. Therefore, an alternative longitudinal bias scheme is needed to maintain the sensitivity of the sensor.

SUMMARY OF THE INVENTION

To enhance the sensor's permeability, an alternative longitudinal bias scheme is employed in CPP sensors, namely an in-stack longitudinal bias stack (LBS) which is located at either the top or the bottom of the sensor. The hard bias layer at each side surface of the sensor has been eliminated by providing a bias stack in the sensor stack for longitudinally biasing the free layer of the sensor. The bias stack may comprise a metallic spacer such as Ta and a ferromagnetic longitudinal biasing layer (LBL). The LBL may be a hard biasing layer or a ferromagnetic pinned layer which has its magnetic moment pinned by exchange coupling with an antiferromagnetic (AFM) pinning layer. The metallic spacer may be an antiparallel (AP) coupling layer such as ruthenium (Ru) or tantalum (Ta). In a sensor where the free layer is located closer to the top of the sensor than to the bottom of the sensor the bias stack is located at the top of the sensor and in a sensor where the free layer is located at the bottom of the sensor the bias stack is located at the bottom of the sensor. The invention also applies to a CPP spin valve sensor wherein a nonmagnetic electrically conductive spacer layer is employed in lieu of the barrier layer. The spacer layer is typically made of copper (Cu). The present invention also includes several unique methods of making the sensor, depending upon whether the sensor is a top located free layer type of sensor or a bottom located free layer type of sensor.

An object of the present invention is to improve the longitudinal biasing of a free layer in a current perpendicular to the planes (CPP) read sensor and prevent possible shorts between free and pinned layers during lapping.

Another object is to obviate the stiffening of side portions of a free layer so that the free layer can be provided with a narrow track width for improving the track width density of the read head.

A further object is to provide methods of making the read head with a flux guide and longitudinal biasing of the free layer.

Other objects and attendant advantages of the invention will be appreciated upon reading the following description taken together with the accompanying drawings.

BRIEF DESCRIPTION OF THE DRAWINGS

FIG. 6 is a partial view of the slider and a merged magnetic head as seen in plane 6—6 of FIG. 2;

FIG. 7 is a partial ABS view of the slider taken along plane 7—7 of FIG. 6 to show the read and write elements of the merged magnetic head;

FIG. 8 is a view taken along plane 8—8 of FIG. 6 with all material above the coil layer and leads removed;

FIG. 20 is a block diagram showing ion milling and back filling, removal of the third mask, deposition of a second lead layer (L2) and formation of the second shield layer (S2);

FIG. 29 is a top view of FIG. 28 after removing the second mask and forming a third mask;

FIG. 30 is a block diagram showing ion milling of the sensor material layers in FIG. 29 down to the free layer, backfilling with alumina, removal of the first mask and deposition of the second lead layer and the second shield layer;

FIG. 31 is the same as FIG. 29 after the steps shown in FIG. 30 are performed and after lapping to the ABS;

DESCRIPTION OF THE PREFERRED EMBODIMENTS

Magnetic Disk Drive

Figure 1:
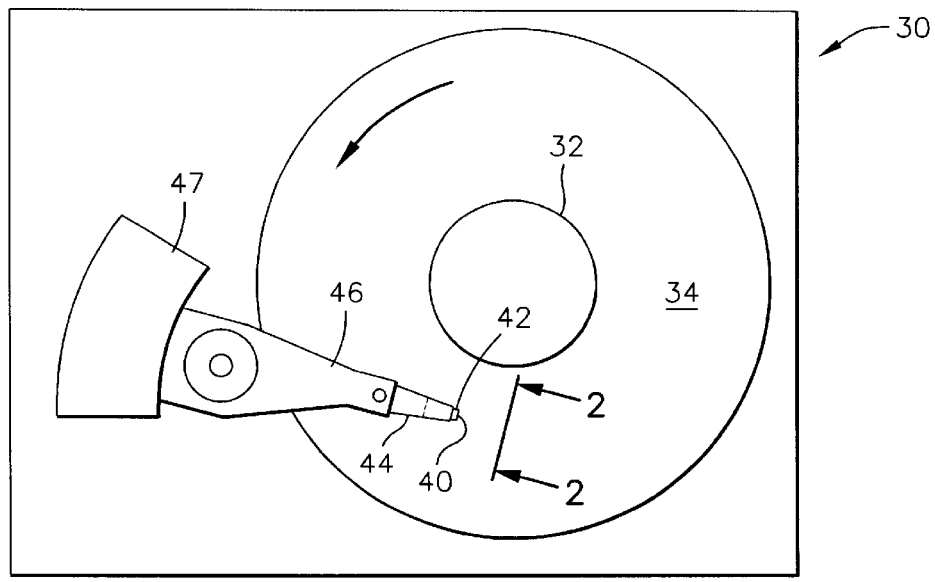
FIG. 1 is a plan view of an exemplary magnetic disk drive.
Figure 2:
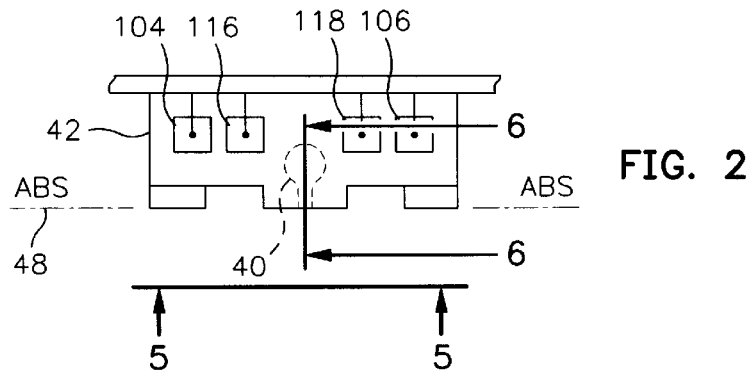
FIG. 2 is an end view of a slider with a magnetic head of the disk drive as seen in plane 2—2 of FIG. 1.
Figure 3:
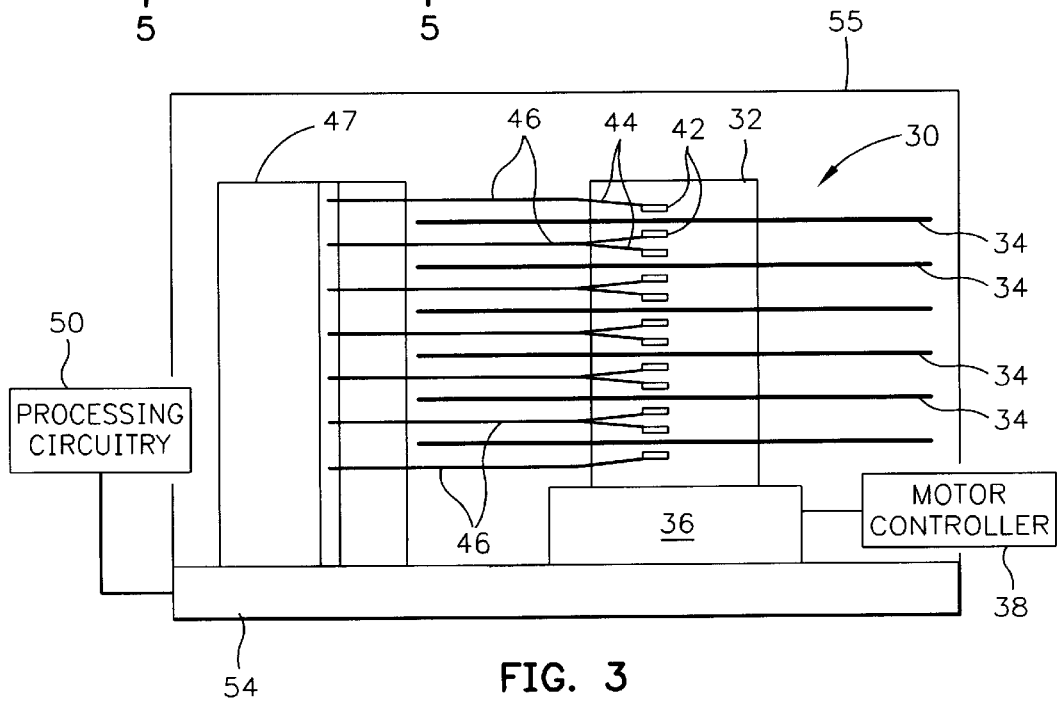
FIG. 3 is an elevation view of the magnetic disk drive wherein multiple disks and magnetic heads are employed.
Figure 4:
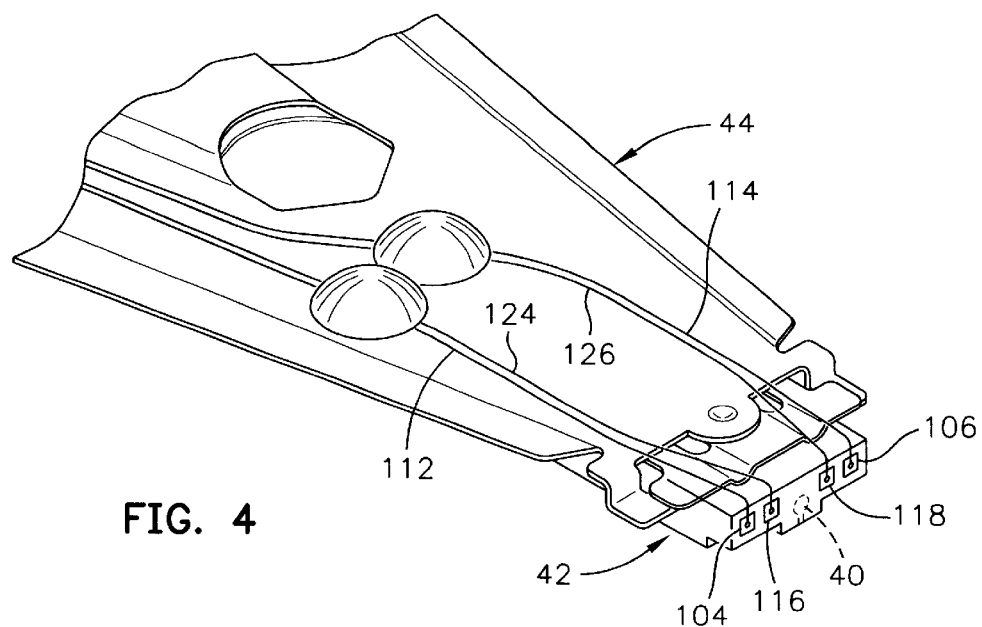
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
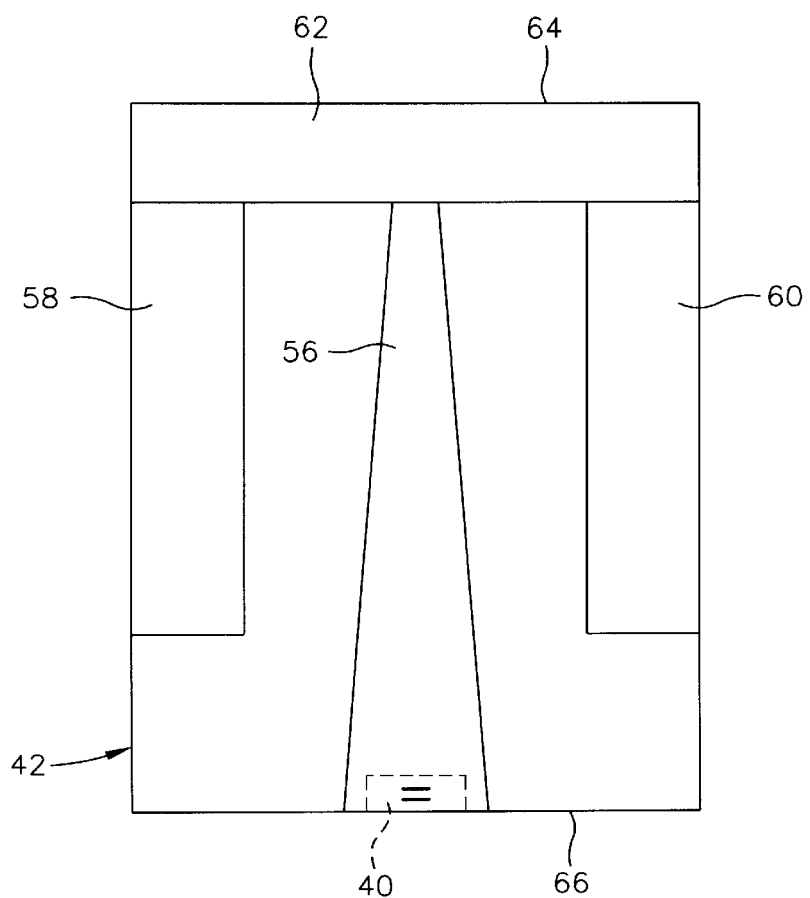
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

FIG. 6 is a side cross-sectional elevation view of a merged magnetic head 40, which includes a write head portion 70 and a read head portion 72, the read head portion employing a tunnel junction sensor and flux guide 74 of the present invention. FIG. 7 is an ABS view of FIG. 6. The tunnel junction sensor, the flux guide 74 and an insulation layer 75 may be sandwiched between first and second lead layers 76 and 78 which, in turn, are sandwiched between ferromagnetic first and second shield layers 80 and 82. In response to field signals from the rotating disk, the resistance of the sensor changes. A tunneling current ($I_T$) conducted through the sensor causes these resistance changes to be manifested as potential changes. These potential changes are then processed as readback signals by the processing circuitry 50 shown in FIG. 3. The tunneling current ($I_T$) may be conducted through the tunnel junction sensor perpendicular to the planes of its thin film surfaces by the first and second shield layers 80 and 82 as well as the first and second leads 76 and 78. In a piggyback head the second shield layer and the first pole piece layer are separate layers which are separated by a nonmagnetic isolation layer.

The write head portion 70 of the magnetic head 40 includes a coil layer 84 which is sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

Figure 9:
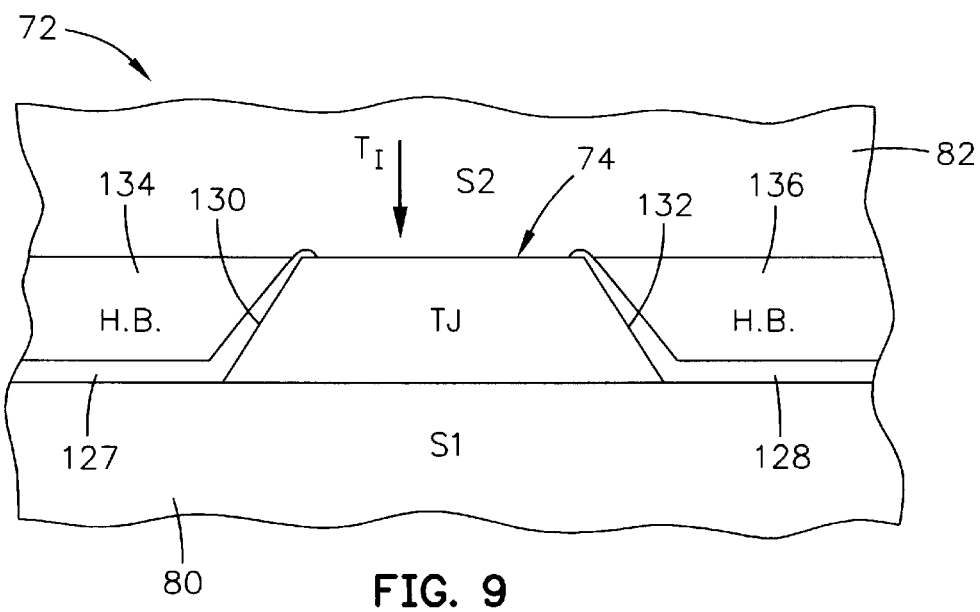
FIG. 9 is an enlarged ABS illustration of the tunnel junction read head.

FIG. 9 is an enlarged isometric ABS illustration of the prior art read head portion shown in FIG. 7. The read head includes the tunnel junction sensor 74. First and second insulation layers 127 and 128, such as alumina ($Al_2O_3$), cover the first shield layer 80 on each side of the tunnel junction sensor 74 as well as slightly covering first and second side walls 130 and 132 of the sensor. First and second hard bias layers 134 and 136 are on the insulation layers 127 and 128 and are adjacent the side walls 130 and 132. The hard bias layers 134 and 136 cause magnetic fields to extend longitudinally through the sensor 74 for stabilizing the free layer. The sensor 74 and the first and second hard bias layers 134 and 136 are located between ferromagnetic first and second shield layers 80 and 82 which may serve as leads for conducting the current through the sensor 74.

The Invention

Figure 21:
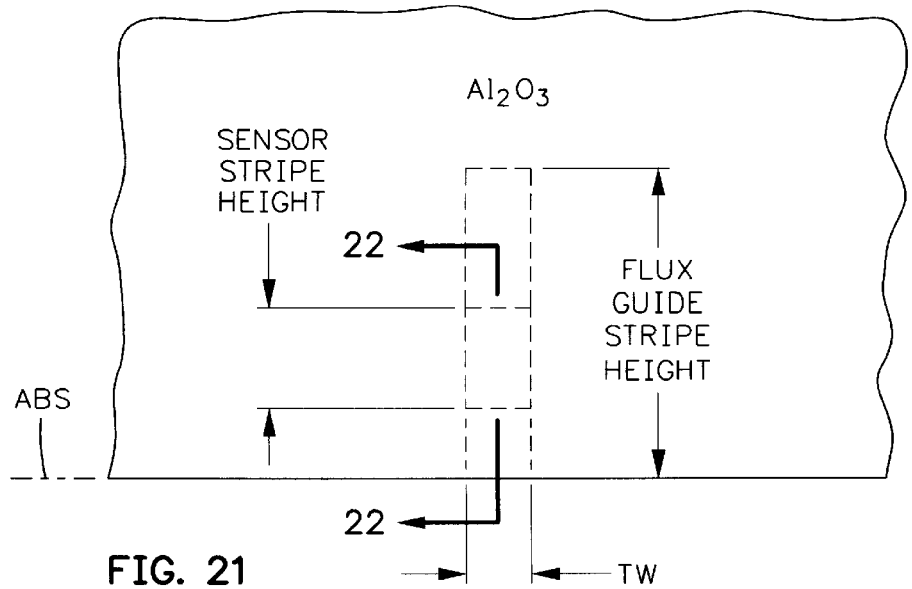
FIG. 21 is a top view of FIG. 19 after the steps in FIG. 20 and lapping of the wafer to the ABS.
Figure 22:
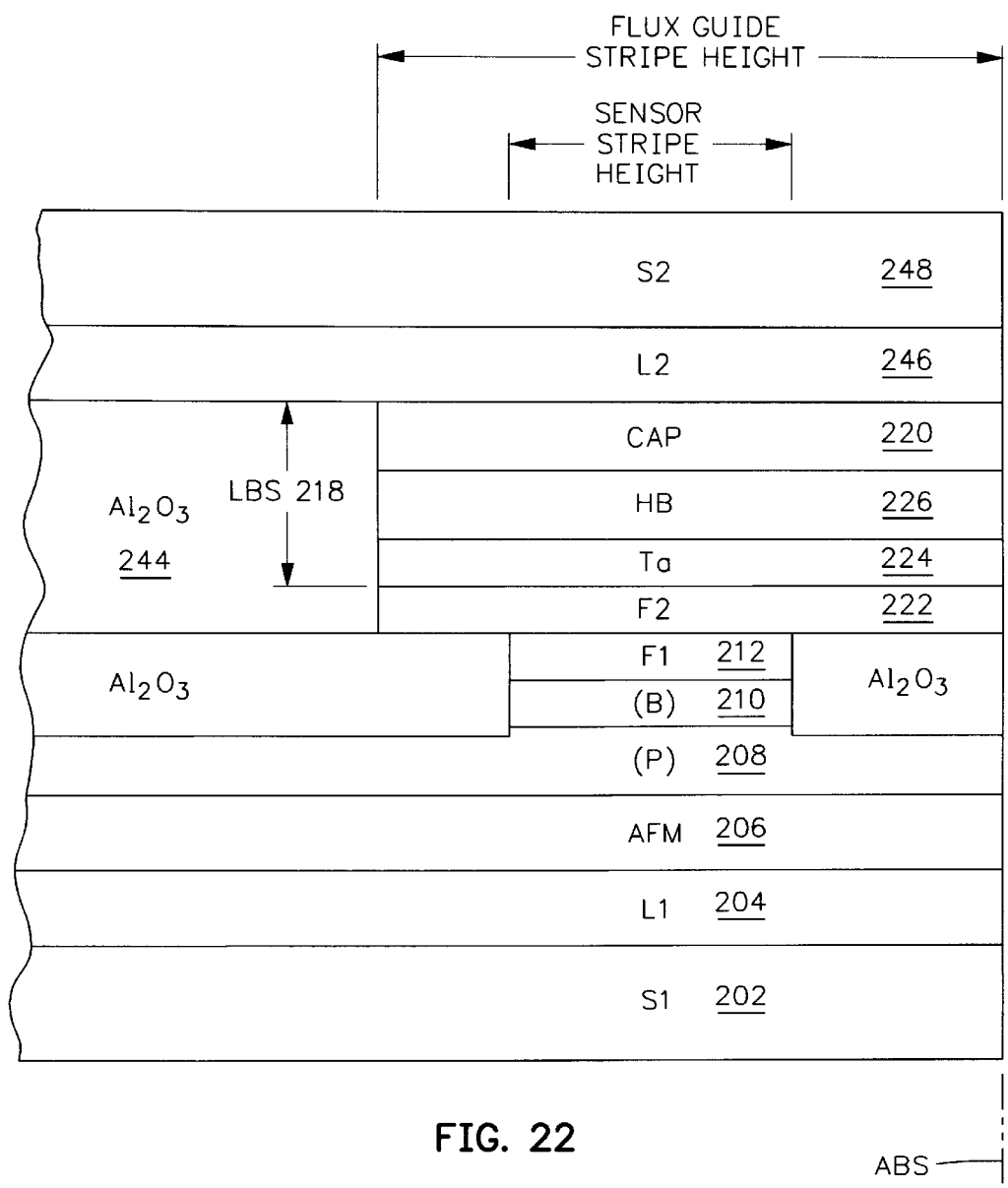
FIG. 22 is a view taken along plane 22—22 of FIG. 21.
Figure 32:
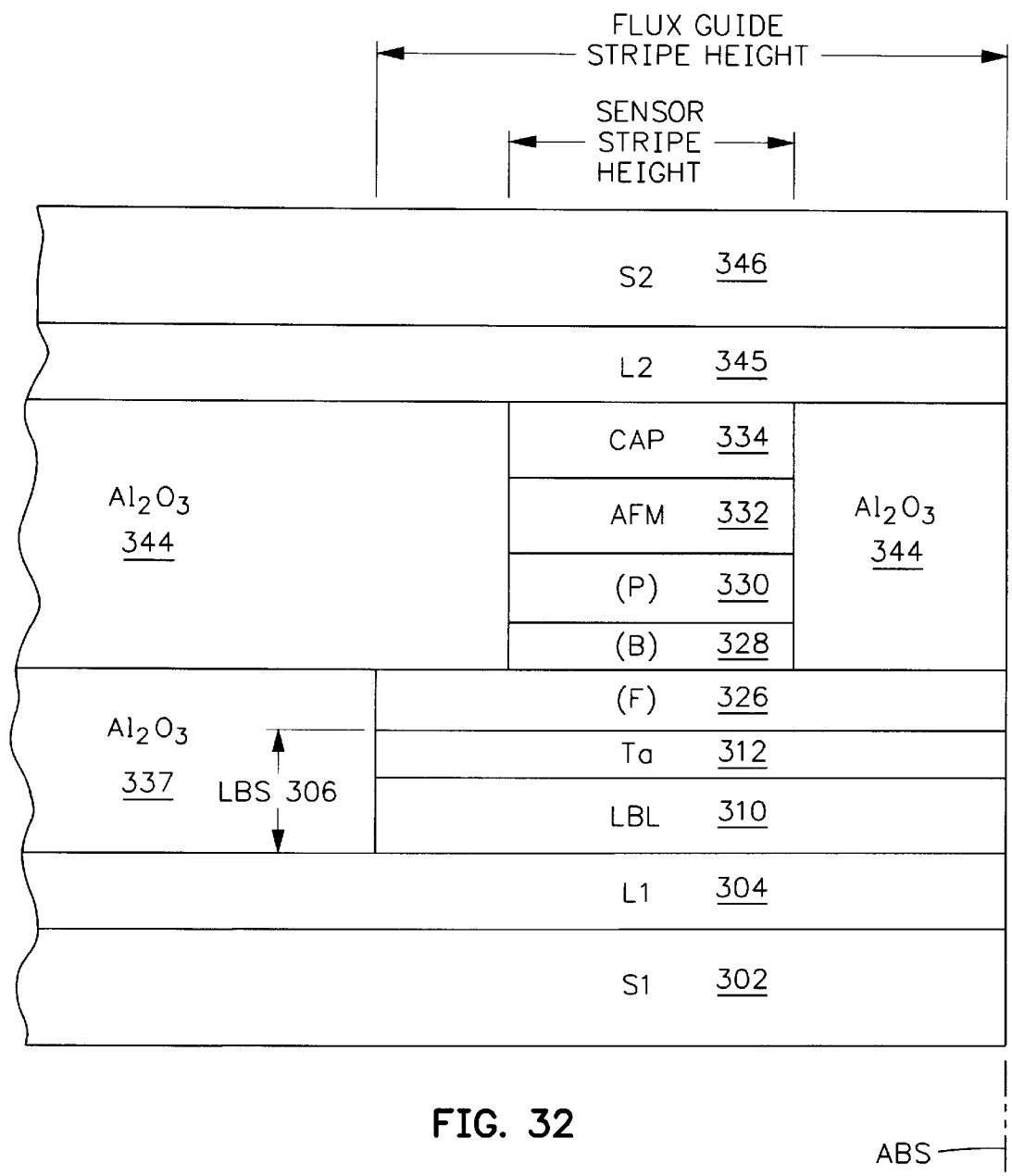
FIG. 32 is a view taken along plane 32—32 of FIG. 31.

Longitudinal cross-sections of two embodiments of the present invention are illustrated in FIGS. 22 and 32 wherein, in FIG. 22, a magnetic head assembly is shown which has a top located free layer 222, and FIG. 32 shows a magnetic head assembly with a flux guide at the ABS and a recessed tunnel junction sensor with a bottom located free layer 326. The magnetic head assembly in FIG. 22 is made by various steps shown in FIGS. 10–21 and the magnetic head assembly in FIG. 32 is made by various steps shown in FIGS. 23–31. In each of the methods of making, as shown in FIGS. 10–21 or FIGS. 23–31, various layers may be formed on a wafer (not shown) by various sputtering techniques, such as ion beam sputtering or magnetron sputtering which are well known in the art, various masks may be formed, such as photoresist masks on the layers, milling may be implemented to remove exposed portions of the layers about the mask and the mask is then removed. The mask may be formed by first spinning a layer of photoresist on the layers, exposing the photoresist mask to light in areas that are to be removed, assuming that the photoresist is a positive photoresist, and then exposing the photoresist to a developer which removes the exposed portions of the mask.

It should be understood that a plurality of magnetic head assemblies are typically formed in rows and columns on a wafer by the above techniques after which the wafer is diced into rows of magnetic head assemblies. Each row of magnetic head assemblies is then lapped to the air bearing surface and each row of magnetic head assemblies is then diced into individual magnetic head assemblies. The magnetic head assemblies are then mounted on suspensions for use in a magnetic disk drive. The methods described hereinbelow illustrate the fabrication of individual magnetic head assemblies out of a plurality of such magnetic head assemblies in the aforementioned rows and columns.

Figure 10:
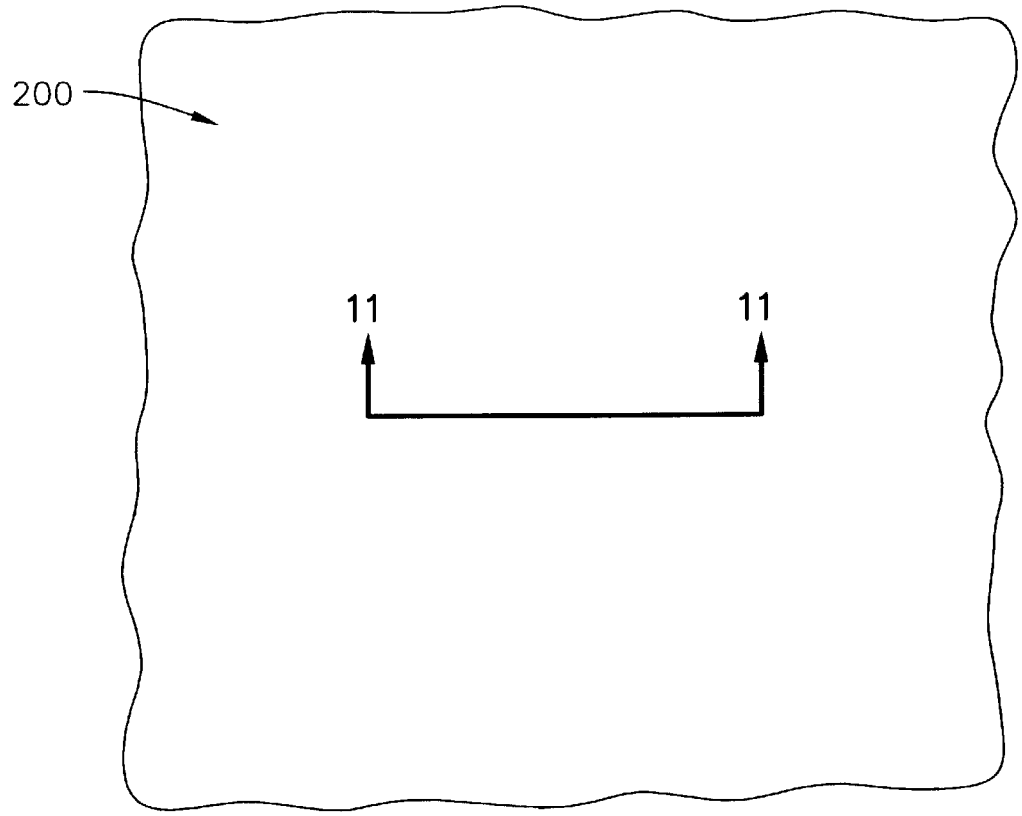
FIG. 10 is a top view of sensor material layers deposited on a wafer (not shown)
Figure 11:
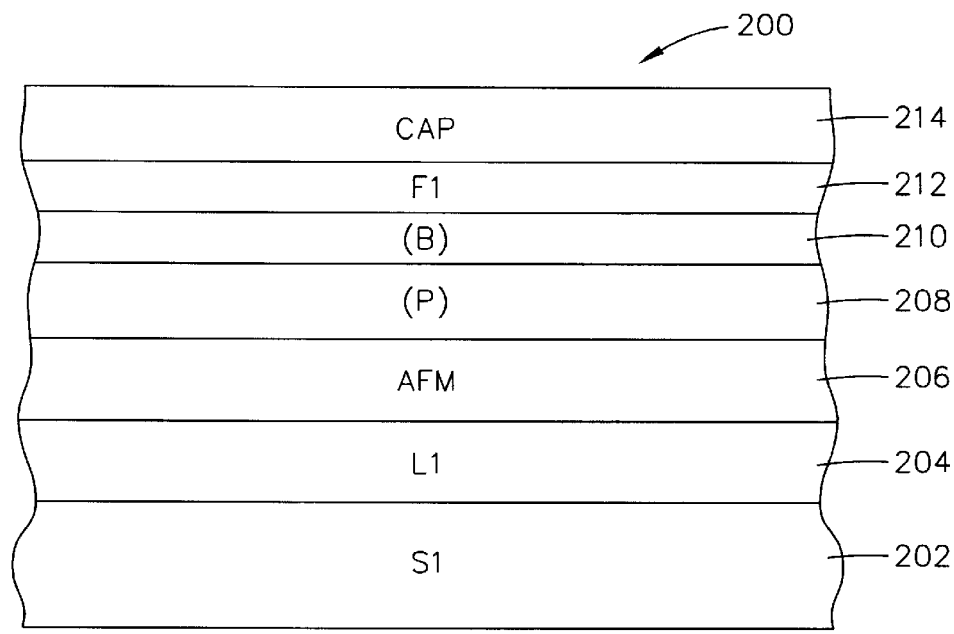
FIG. 11 is a view taken along plane 11—11 of FIG. 10.

FIG. 10 illustrates a plan view of the top of sensor material layers 200 which are illustrated in cross-section in FIG. 11. The sensor material layers have been formed, such as by sputter deposition, and include the first shield layer (S1) 202 deposited on a wafer (not shown) and which may be the same as the first shield layer 80 shown in FIGS. 6 and 7, optionally, a first lead layer (L1) 204 is formed on the first shield layer, an antiferromagnetic pinning layer (AFM) 206 is formed on the first lead layer, a ferromagnetic pinned layer (P) 208 is formed on the pinning layer, a tunneling barrier layer (B) 210 is formed on the pinned layer, a ferromagnetic first portion of free layer (F1) 212 is formed on the barrier layer and a nonmagnetic electrically conductive cap layer 214 is deposited on the first portion of the free layer.

Figure 12:
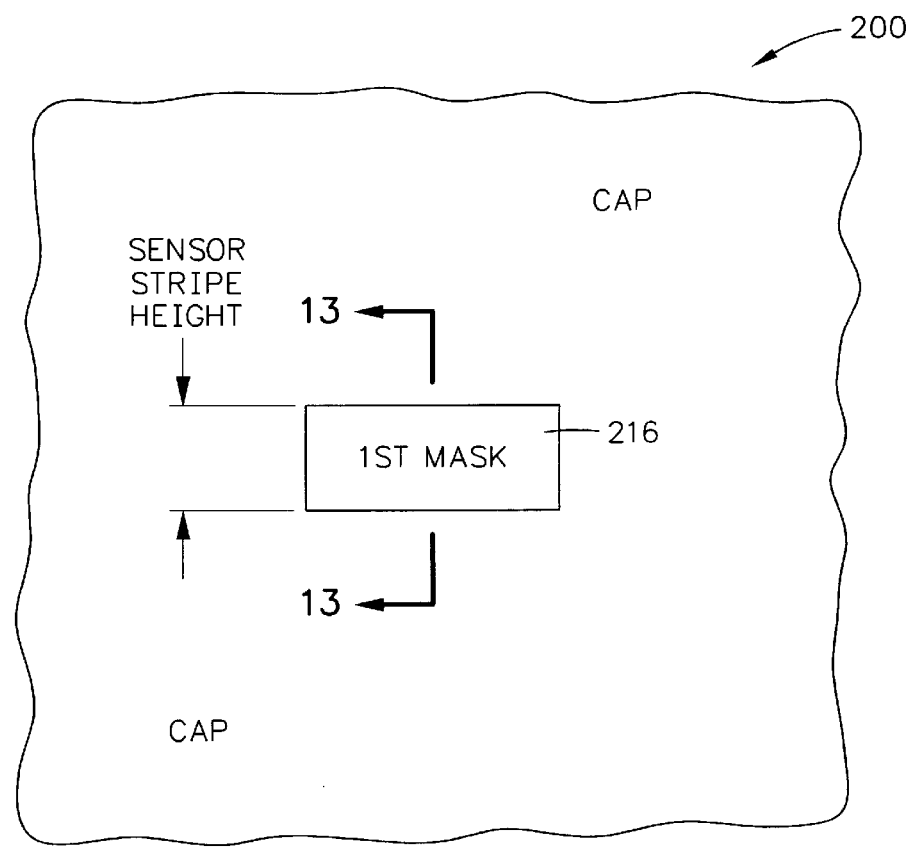
FIG. 12 is the same as FIG. 10 except a first mask has been formed for defining a stripe height of the sensor.
Figure 13:
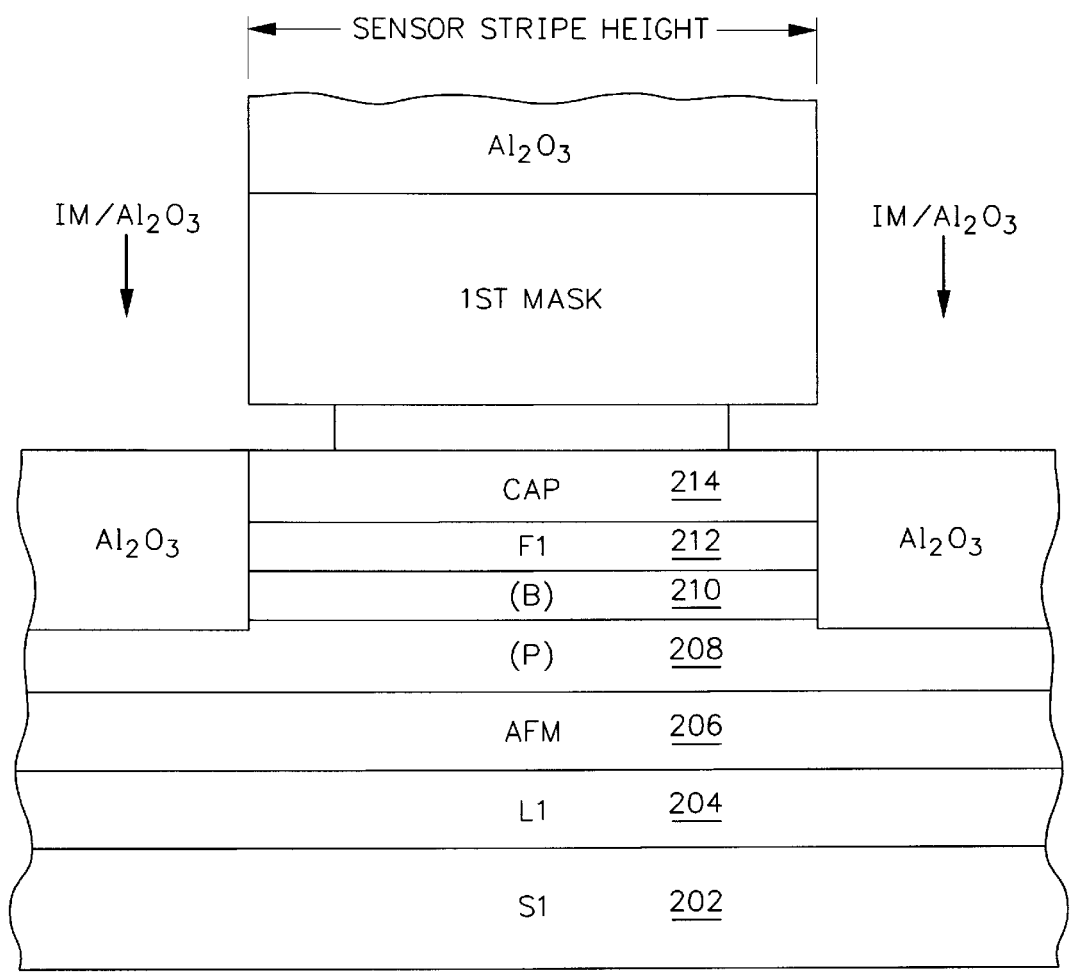
FIG. 13 is a view taken along plane 13—13 of FIG. 12.
Figure 14:
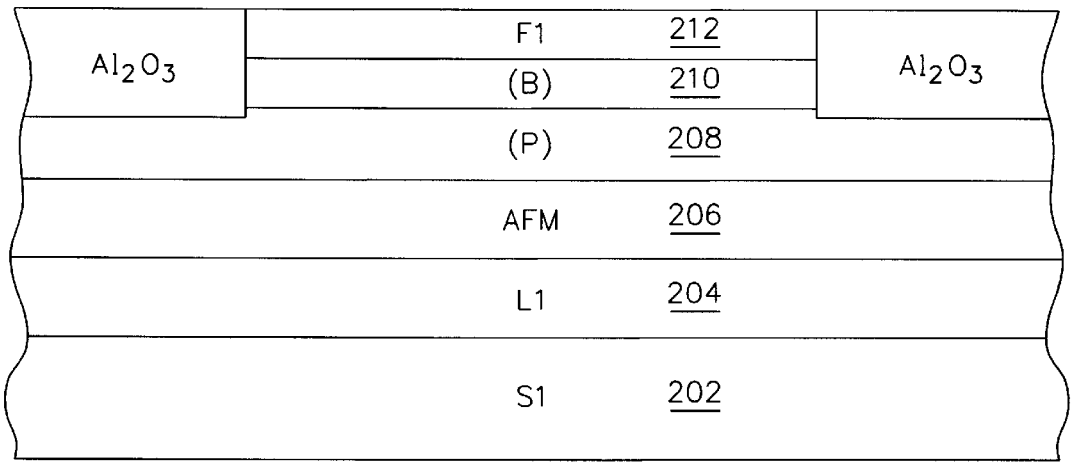
FIG. 14 is the same as FIG. 13 after removal of the first mask and removal of a cap layer.
Figure 15:
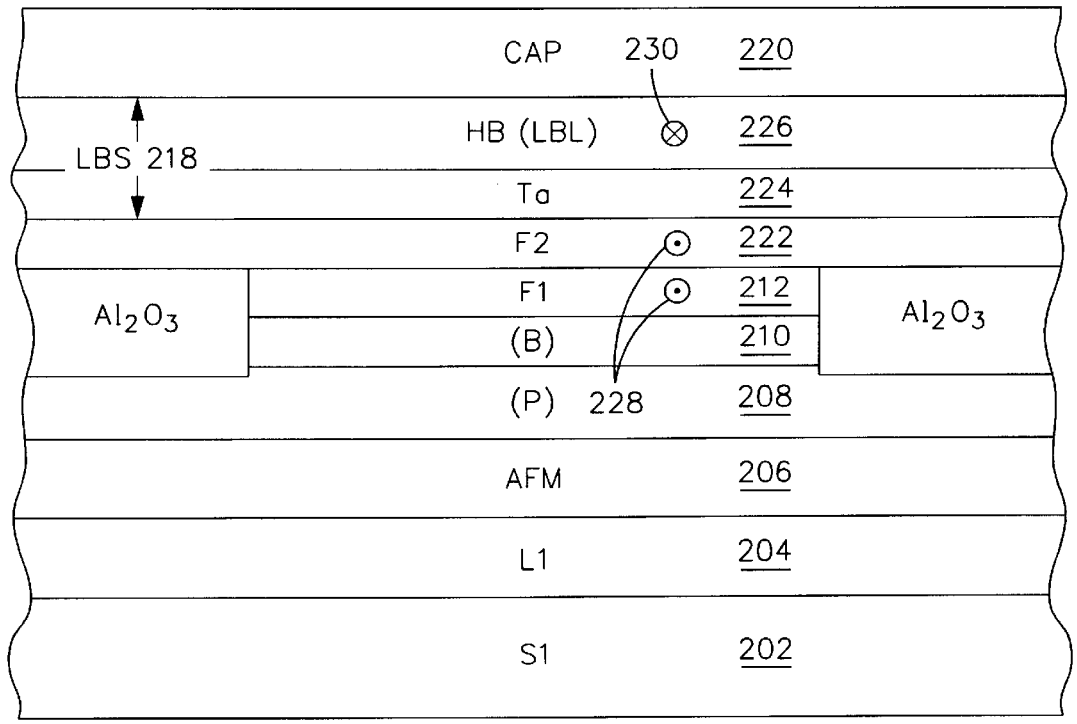
FIG. 15 is the same as FIG. 14 except a bias stack and another cap layer have been formed.
Figure 34:
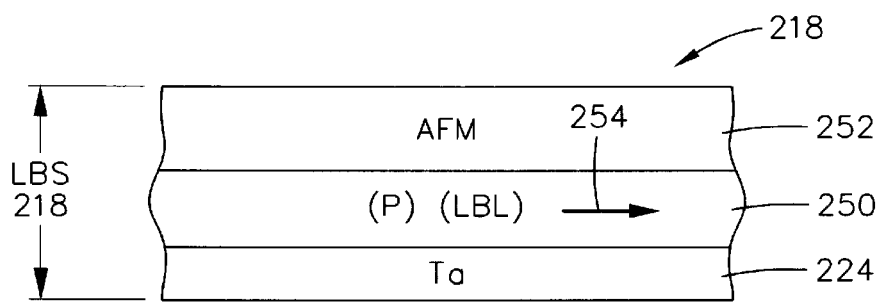
FIG. 34 is a cross-section of a second embodiment of the bias stack.
Figure 35:
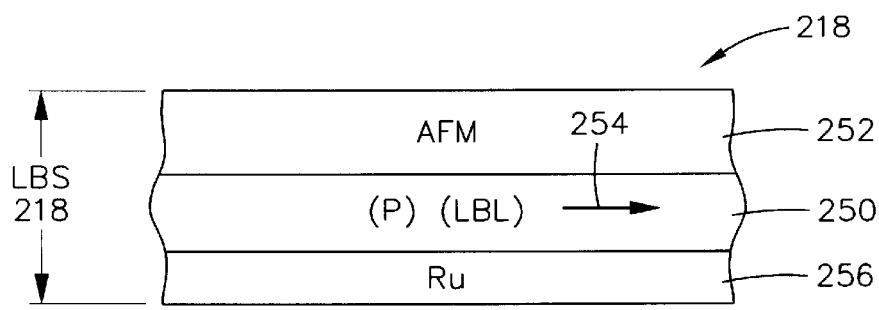
FIG. 35 is a cross-section of a third embodiment of the bias stack.

FIG. 12 is the same as FIG. 10 except a bilayer photoresist first mask 216 has been formed on the sensor material layers for defining a stripe height of the sensor. FIG. 13 is a view taken along plane 13—13 of FIG. 12 except ion milling (IM) has been implemented to remove portions of the sensor material layers exposed about the mask and alumina ($Al_2O_3$) has been backfilled up to the top of the cap layer. FIG. 14 is the same as FIG. 13 except the first mask has been removed and the cap layer 214 has been removed, such as by sputter etching. FIG. 15 is the same as FIG. 14 except a second portion of the free layer (F2) 222 has been formed, a longitudinal bias stack (LBS) 218 has been formed and another cap layer 220 has been formed on the bias stack. The bias stack 218 may include a spacer layer 224, such as Ta, located between the second free layer portion 222 and a hard bias longitudinal bias layer (LBL) 226, as shown in FIGS. 15 and 35. With this arrangement the LBL 226 longitudinally biases the magnetic moment 228 of the free layers 212 and 222 by a magnetostatic coupling due to the magnetic moment 230 of the LBL 226. Alternatively, the LBL may be a ferromagnetic pinned layer (P) (LBL) 250 which has its moment 254 pinned by exchange coupling with an antiferromagnetic (AFM) layer 252, as shown in FIG. 34. FIG. 35 shows a modification of FIG. 34 wherein a ruthenium (Ru) layer 256 is substituted for the Ta layer 224. The Ru layer is sufficiently thin, such as so that there is an antiparallel coupling between the (P) (LBL) layer 250 and the free layer portions 222 and 212. In the case of the metallic spacer 224, such as Ta, to separate the LBL from the second free layer 222, the thickness can be 5 Å–70 Å.

Figure 16:
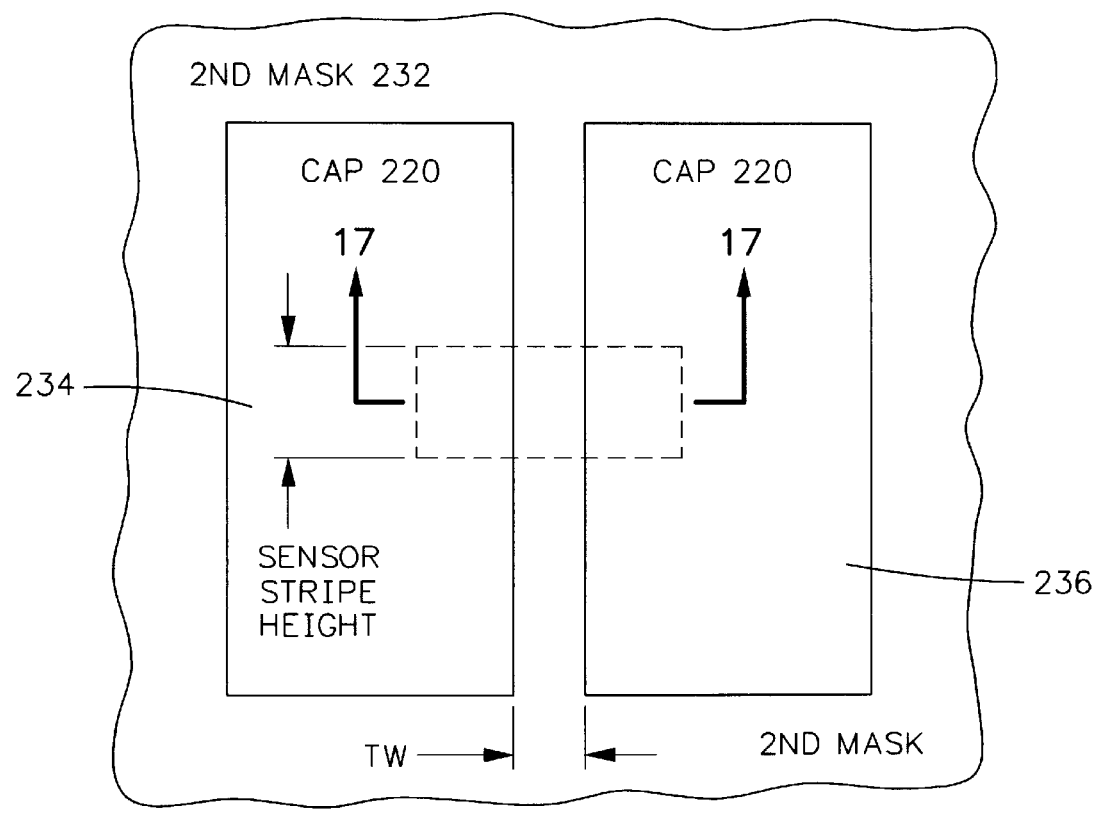
FIG. 16 is a top view of FIG. 15 after forming a second mask thereon for defining a stripe height of the sensor.
Figure 17:
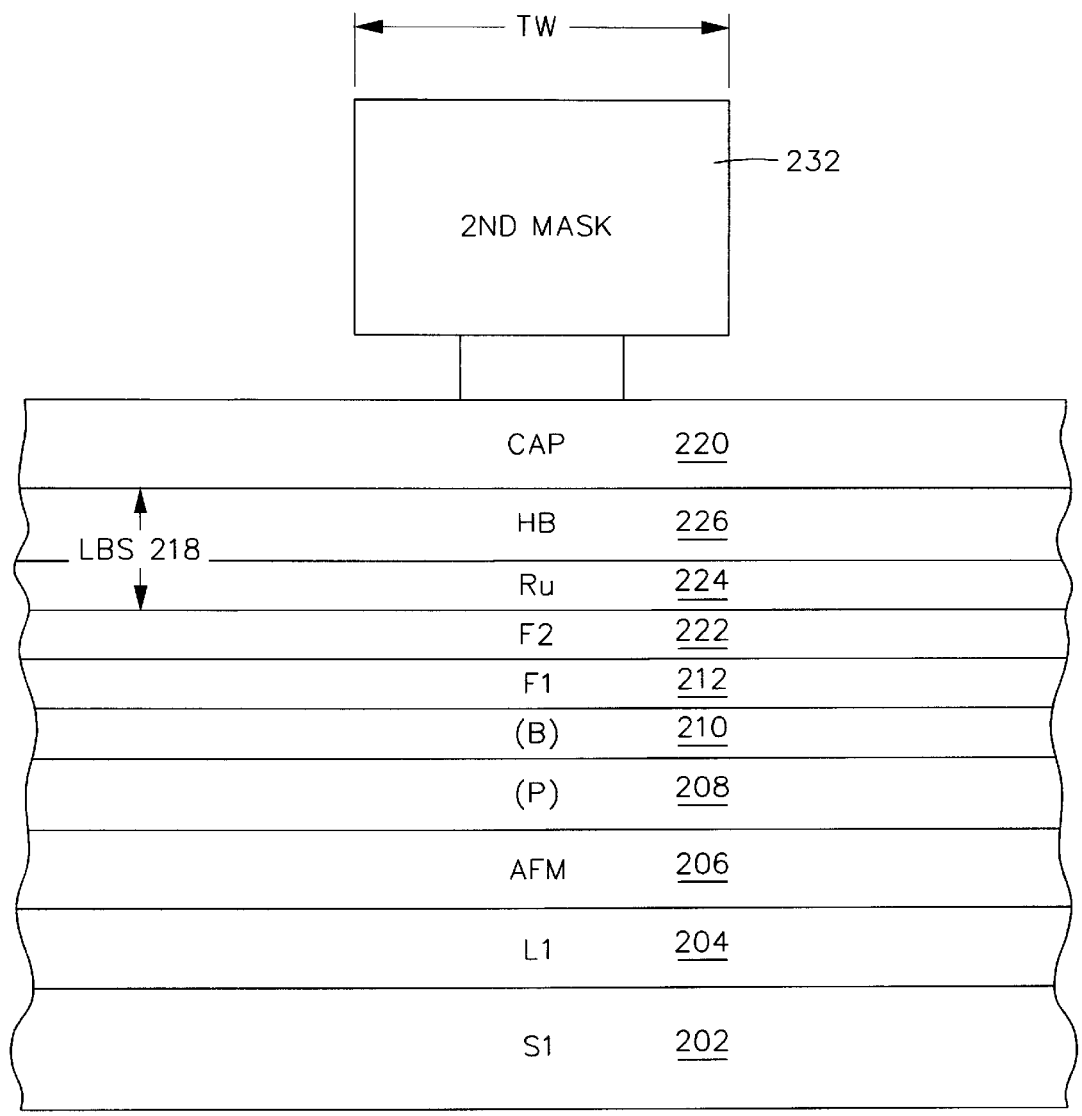
FIG. 17 is a view taken along plane 17—17 of FIG. 16.
Figure 18:
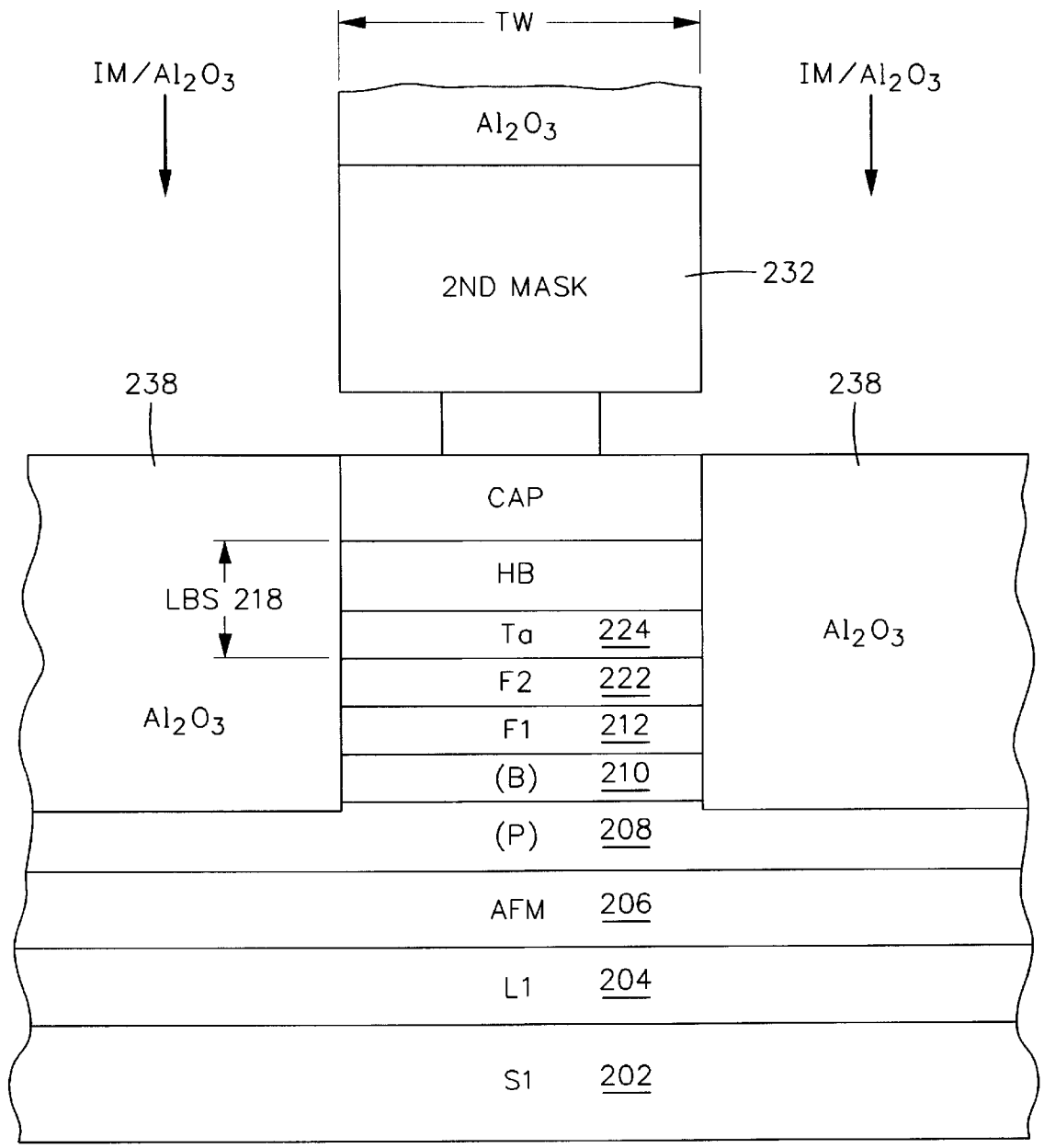
FIG. 18 is the same as FIG. 17 except the sensor material layers have been milled down to the antiferromagnetic (AFM) pinning layer and backfilled with alumina ($Al_2O_3$)

FIG. 16 is a top view of FIG. 15 after the formation of a second photoresist mask 232 which has been formed on top of the cap layer 220 with openings 234 and 236 for defining a track width of the sensor. FIG. 17 is a cross-section taken along plane 17—17 of FIG. 16 showing the second mask 232 with a width equal to the desired track width (TW). FIG. 18 is the same as FIG. 17 except ion milling (IM) has been implemented to mill at least through the barrier layer (B) within the openings 234 and 236 in FIG. 16 down to the pinning layer 206 and backfilled with a second insulation layer 238 which may be alumina ($Al_2O_3$).

Figure 19:
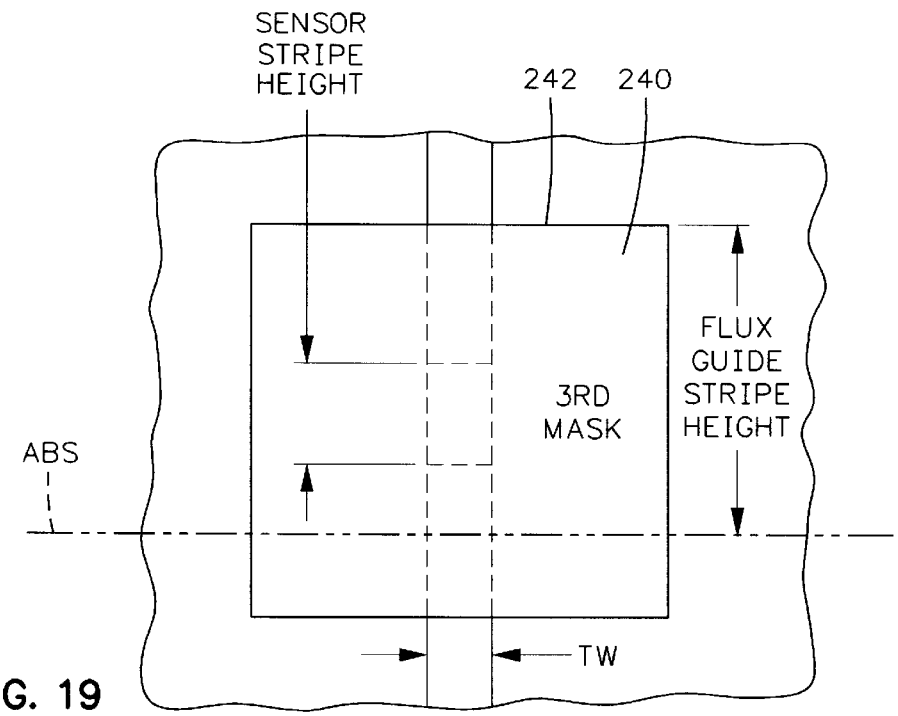
FIG. 19 is a top view of FIG. 18 after the removal of the second mask and formation of a third mask for defining a stripe height of the flux guide.

FIG. 19 is a top view of FIG. 18 after removal of the second mask 232 and after formation of a third bilayer photoresist mask 240 for defining a back edge 242 of the flux guide. In FIG. 20 there is shown a block diagram wherein the sensor material layers about the mask 240 have been milled away, which milled layers include the second free layer 222, the metallic spacer or the AP coupling layer 224 and the LBL 226 of the bias stack 218 and the cap layer 220, backfilling with a third insulation layer 244, which may be alumina ($Al_2O_3$), removal of the mask 240, forming a second lead layer (L2) 246 on the remaining layers and forming a second shield layer (S2) 248, which may be the same as the second shield layer 82 in FIGS. 6 and 7, which steps are also illustrated in FIG. 22. FIG. 21 shows a lapping of the sensor material layers to the air bearing surface (ABS) which is also shown in FIG. 22. FIG. 22 shows a cross-section of the read head which can be employed as the read head 72 shown in FIG. 6.

Another Embodiment (Top Spin Valve)

Figure 23:
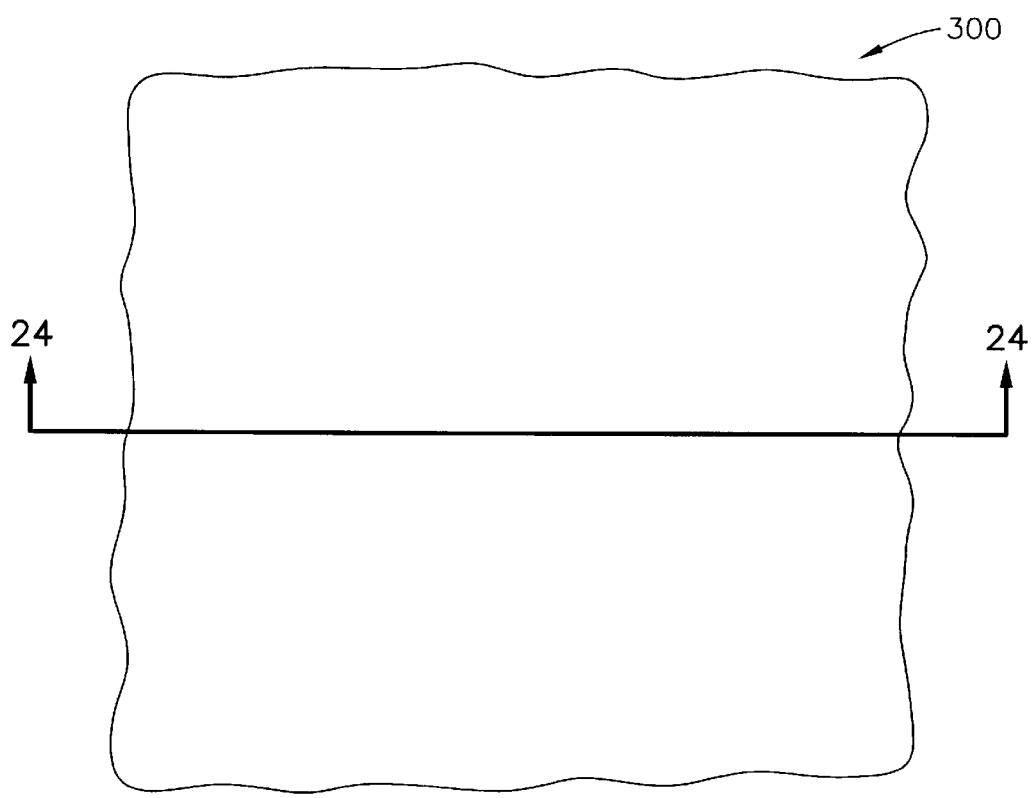
FIG. 23 is a top view of sensor material layers formed on a wafer (not shown)
Figure 24:
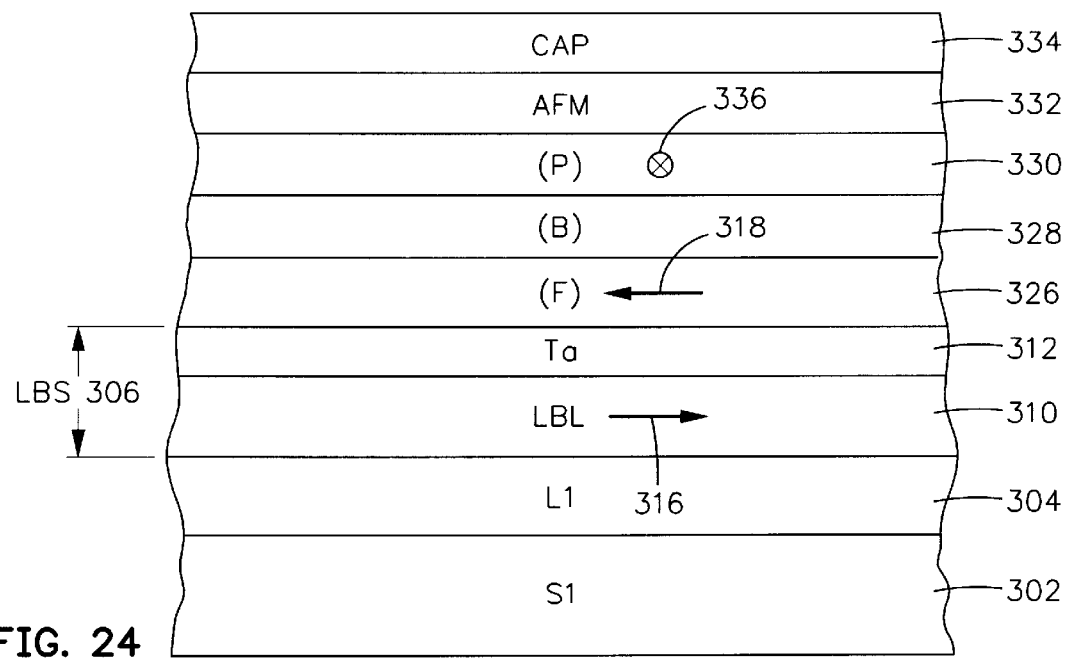
FIG. 24 is a view taken along plane 24—24 of FIG. 23.
Figure 33:
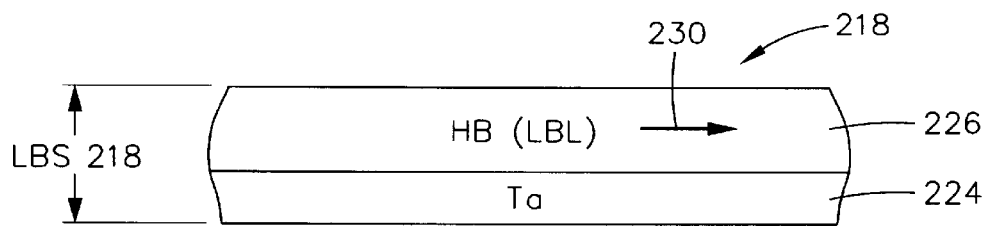
FIG. 33 is a cross-section of a first embodiment of the bias stack.

FIG. 23 is a plan view of the top of sensor material layers 300 which are shown in cross-section in FIG. 24. In FIG. 24 a first shield layer 302, which may be the same as the first shield layer 80 in FIGS. 6 and 7, has been formed on a wafer (not shown), optionally a first lead layer (L1) 304 has been formed on the first shield layer, a longitudinal bias stack (LBS) 306 has been formed on the first lead layer, a free layer (F) 326 has been formed on the bias stack 306, a barrier layer (B) 328 has been formed on the second free layer, a ferromagnetic pinned layer (P) 330 has been formed on the barrier layer, an antiferromagnetic pinning layer (AFM) 332 has been formed on the pinned layer and a nonmagnetic electrically conductive cap layer 334 has been formed on the pinning layer. The pinning layer 332 is exchange coupled to the pinned layer 330 for pinning a magnetic moment 336 of the pinned layer perpendicular to the ABS. The bias stack 306 includes a ferromagnetic longitudinal biasing layer (LBL) 310, which has been deposited on the first lead layer, and a nonmagnetic coupling layer 312, which may be 5 Å–70 Å of Ta, deposited on the LBL 310. The free layer 326 is deposited on the coupling layer 312, as shown in FIGS. 24 and 33. Other options, as dicussed hereinabove, are shown in FIGS. 34 and 35. The LBL 310 has a magnetic moment 316 which longitudinally stabilizes a magnetic moment 318 of the free layer 326 parallel to the ABS.

Figure 25:
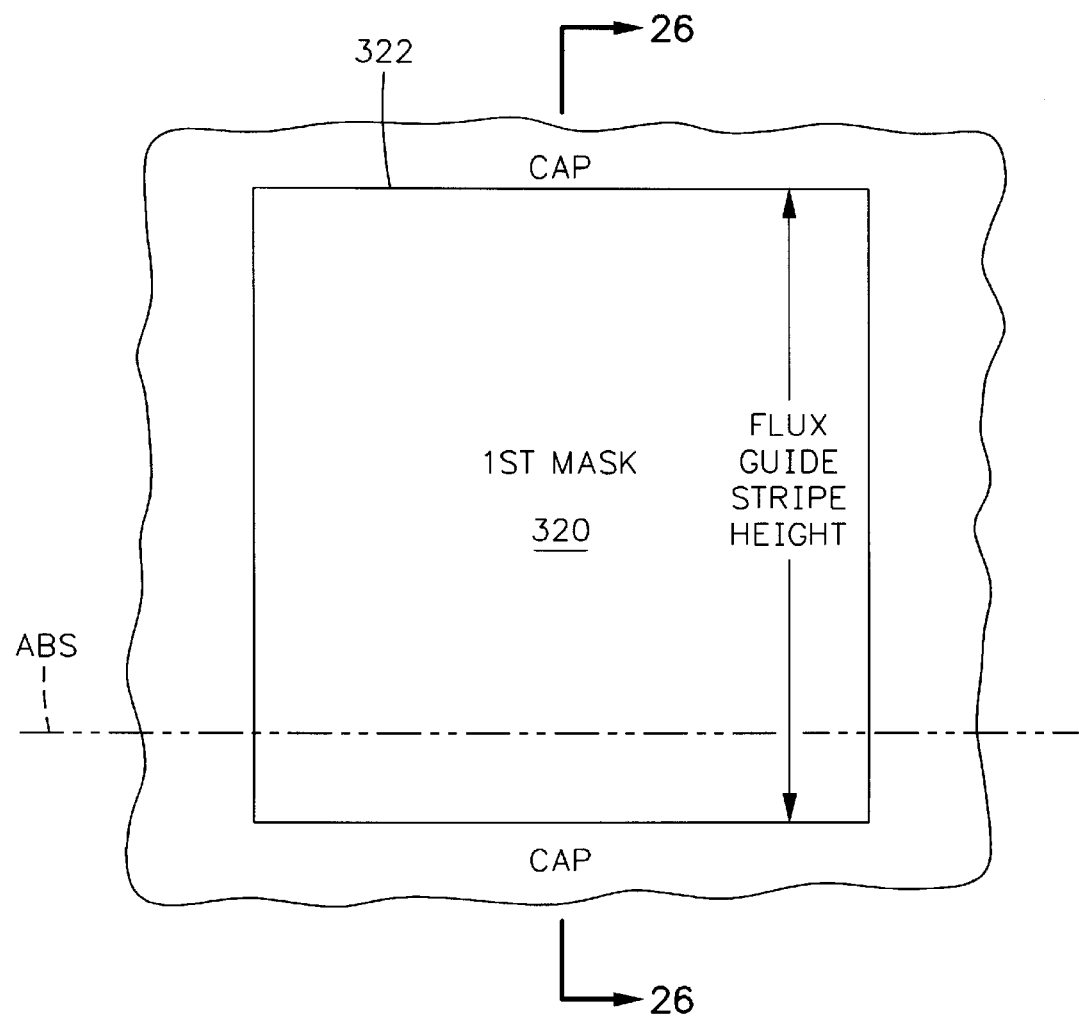
FIG. 25 is a top view of FIG. 24 with a first mask formed thereon for defining a stripe height of a flux guide.
Figure 26:
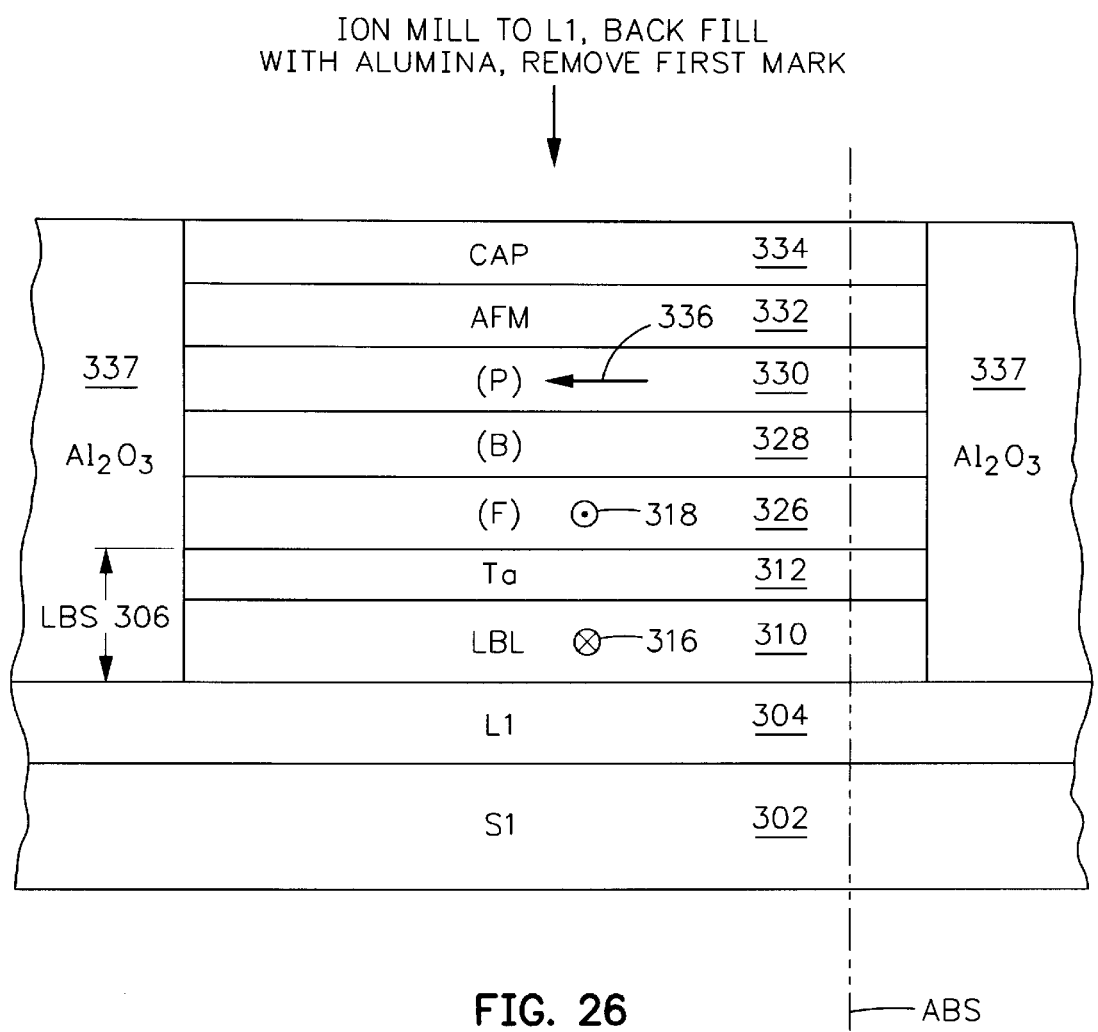
FIG. 26 is a view along plane 26—26 of FIG. 25 illustrating ion milling the layers in FIG. 25 to the first lead layer (L1), backfilling with alumina and removing the first mask.

FIG. 25 is a top view of FIG. 24 except a bilayer photoresist first mask 320 has been formed for defining a back edge 322 of the flux guide. In FIG. 26 ion milling has been implemented to remove the sensor material layers down to the first lead layer 304, the space due to milling has been backfilled with alumina ($Al_2O_3$) to form a first insulation layer 337 and the first mask 320 has been removed.

Figure 27:
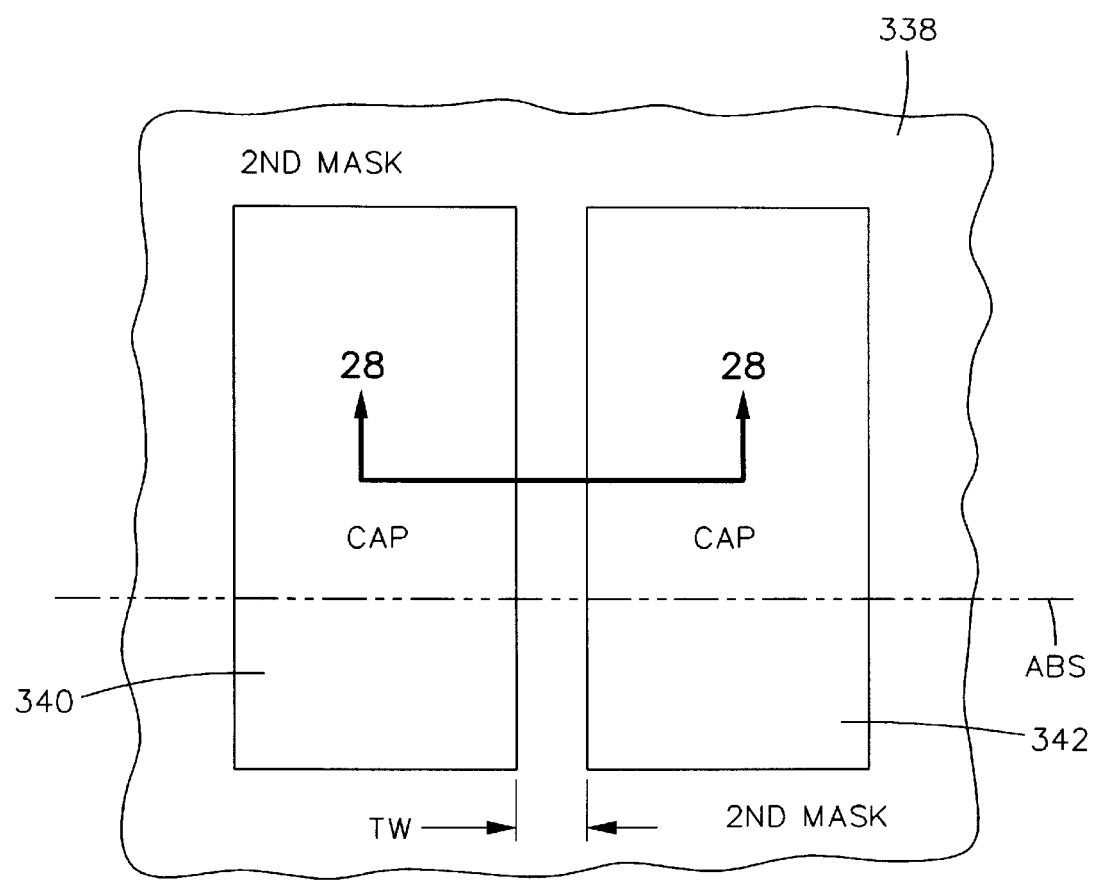
FIG. 27 is a top view of FIG. 26 after formation of a second mask for defining a track width of the flux guide and the sensor.
Figure 28:
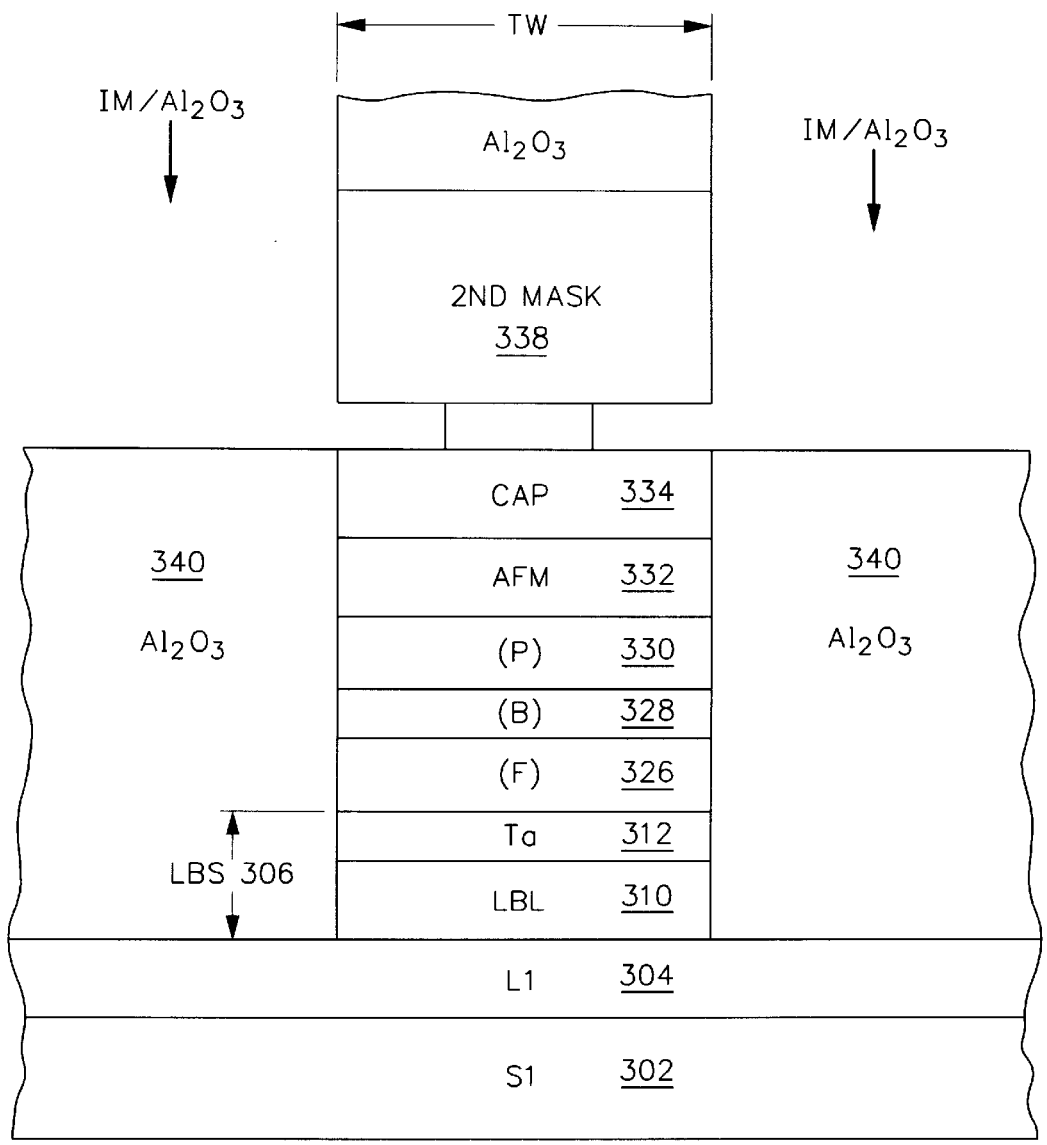
FIG. 28 is a view taken along plane 28—28 of FIG. 27.

FIG. 27 is a top view of FIG. 26 except a bilayer photoresist second mask 338 has been formed on top of the layers with openings 340 and 342 for defining a track width (TW) of the sensor. FIG. 28 is a view taken along plane 28—28 of FIG. 27 except ion milling (IM) has been implemented to remove the sensor material layers about the second mask 338 down to L1 or S1 and backfilled with alumina ($Al_2O_3$) up to the cap layer 334 to form a second insulation layer 340.

FIG. 29 is a top view of FIG. 28 except the second mask 338 has been removed and a bilayer photoresist third mask 342 has been formed for defining a stripe height of the sensor. In FIG. 30 the sensor material layers have been ion milled down to the free layer (F) 326 and the space caused by the milling has been backfilled with alumina ($Al_2O_3$) to form a third insulation layer 344, as shown in FIG. 32, optionally a second lead layer (L2) 345 is formed on the remaining layers and a second shield layer (S2) 346, which may be the same as the second shield layer 82 in FIGS. 6 and 7, is formed on the second lead layer, as shown in FIG. 32. The layers are then lapped to define the air bearing surface (ABS). A cross-section taken along plane 32—32 of FIG. 31 shows the final read head in FIG. 32, which may be employed as the read head 72 in FIG. 6.

FIGS. 33, 34 and 35 illustrate various embodiments of the longitudinal bias stack 218 which may be employed in the read head embodiment shown in FIG. 15. FIG. 33 shows the same bias stack 218 as shown in FIG. 15 with the layers 224 and 226. A second embodiment 218, which is illustrated in FIG. 34, is the same as the embodiment shown in FIG. 33 except a ferromagnetic pinning layer (P) 250 is located on the coupling layer 224 and an antiferromagnetic (AFM) pinning layer 252 is located on and exchange coupled to the pinned layer. The pinning layer 252 pins a magnetic moment 254 of the pinned layer parallel to the ABS and parallel to the major thin film planes of the layers with the magnetic moment 228 of the second free layer 224 pinned by antiparallel coupling antiparallel to the magnetic moment 254. The embodiment of the bias stack 218 shown in FIG. 35 is the same as the bias stack shown in FIG. 34 except a ruthenium (Ru) layer 256 is substituted for the tantalum (Ta) coupling layer 224. A reverse order of the layers of the bias stacks 218 shown in FIGS. 33, 34 and 35 may be employed for various embodiments of the bias stack 306 shown in FIG. 32.

Discussion

It should be understood that the present read heads and methods of construction may be employed with any sense current perpendicular to the plane type (CPP) sensor. The read heads and methods described hereinabove employ a barrier layer 210, as shown in FIG. 22 or 328 as shown in FIG. 32, however, it should be understood that a nonmagnetic electrically conductive spacer layer may be employed in lieu thereof. When a nonmagnetic electrically conductive spacer layer is employed the sensor operates as a spin valve sensor with the sense current conducted perpendicular to the major thin film planes of the layers. It should be understood that the first and second leads may be omitted in which case the first and second shield layers would serve as leads for conducting the sense current through the sensor. The ferromagnetic layers may be nickel iron, the barrier layers may be alumina (Al$_2$O$_3$), the antiferromagnetic pinning layers may be platinum manganese (PtMn) and the cap layers may be tantalum (Ta). The ion milling in each of the methods for defining the stripe height of the sensor may be at other levels than that discussed hereinabove provided that the spin valve effect on each side of the layers is terminated. The use of alumina (Al$_2$O$_3$) for the insulation layers is optional and silicon dioxide (SiO$_2$) may be employed in lieu thereof. The spacer layer may be copper (Cu).

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A magnetic head assembly having an air bearing surface (ABS) comprising:
    a tunnel junction sensor recessed from the ABS and including:
        a ferromagnetic pinned layer having a magnetic moment;
        an antiferromagnetic pinning layer exchange coupled to the pinned layer for pinning the magnetic moment of the pinned layer;
        a free layer with a magnetic moment that is free to rotate in response to field signals from a rotating magnetic disk;
        a nonmagnetic spacer layer located between the free layer and the pinned layer; and
        a bias stack including:
            a ferromagnetic biasing layer;
            a metallic coupling layer located between and interfacing said free layer and the biasing layer so that a magnetic moment of the free layer is antiparallel to a magnetic moment of the biasing layer and is thereby longitudinally biased by edge magnetostatic force and/or antiparallel coupling from the biasing layer; and
        a flux guide including an extension of the bias stack and the free layer extending from the tunnel junction sensor to said ABS.

2. A magnetic head assembly as claimed in claim 1 including:
    a write head including:
        ferromagnetic first and second pole piece layers that have a yoke portion located between a pole tip portion and a back gap portion;
        a nonmagnetic write gap layer located between the pole tip portions of the first and second pole piece layers;
        an insulation stack with at least one coil layer embedded therein located between the yoke portions of the first and second pole piece layers; and
        the first and second pole piece layers being connected at their back gap portions; and
    the read head further including a ferromagnetic first shield layer; and
    the tunnel junction sensor and the flux guide being located between the first shield layer and the first pole piece layer.

3. A magnetic head assembly as claimed in claim 2 wherein the free layer is located between pinned layer and the first pole piece layer.

4. A magnetic head assembly as claimed in claim 3 wherein the biasing layer includes:

a ferromagnetic pinned film interfacing the coupling layer and having a magnetic moment; and
an antiferromagnetic pinning film exchange coupled to the pinned film for pinning the magnetic moment of the pinned film.

5. A magnetic head assembly as claimed in claim 4 wherein the coupling layer is selected from the group consisting of Ru, Ta and Ti.

6. A magnetic head assembly as claimed in claim 2 wherein the pinned layer is located between the free layer and the first pole piece layer.

7. A magnetic head assembly as claimed in claim 6 wherein the biasing layer includes:
    a ferromagnetic pinned film interfacing the coupling layer and having a magnetic moment; and
    an antiferromagnetic pinning film exchange coupled to the pinned film for pinning the magnetic moment of the pinned film.

8. A magnetic head assembly as claimed in claim 7 wherein the coupling layer is selected from the group consisting of Ru, Ta and Ti.

9. A magnetic disk drive comprising:
    a write head including:
        ferromagnetic first and second pole piece layers that have a yoke portion located between a pole tip portion and a back gap portion;
        a nonmagnetic write gap layer located between the pole tip portions of the first and second pole piece layers;
        an insulation stack with at least one coil layer embedded therein located between the yoke portions of the first and second pole piece layers; and
        the first and second pole piece layers being connected at their back gap portions; and
    a read head including:
        a tunnel junction sensor recessed from the ABS and including:
            a ferromagnetic pinned layer having a magnetic moment;
            an antiferromagnetic pinning layer exchange coupled to the pinned layer for pinning the magnetic moment of the pinned layer;
            a free layer with a magnetic moment that is free to rotate in response to field signals from a rotating magnetic disk; and
            a nonmagnetic spacer layer located between the free layer and the pinned layer; and
        a bias stack including:
            a ferromagnetic biasing layer; and
            a metallic coupling layer located between and interfacing said free layer and the biasing layer so that a magnetic moment of the free layer is antiparallel to a magnetic moment of the biasing layer and is thereby longitudinally biased by edge magnetostatic force and/or antiparallel coupling; and
        a flux guide including an extension of the bias stack and the free layer extending from the biasing layer to said ABS;
        the read head further including a ferromagnetic first shield layer; and
        the tunnel junction sensor and the flux guide being located between the first shield layer and the first pole piece layer;
    a housing;
    a magnetic disk rotatably supported in the housing;
    a support mounted in the housing for supporting the magnetic head assembly with said ABS facing the magnetic disk so that the magnetic head assembly is in a transducing relationship with the magnetic disk;

a spindle motor for rotating the magnetic disk;

an actuator positioning means connected to the support for moving the magnetic head assembly to multiple positions with respect to said magnetic disk; and a processor connected to the magnetic head assembly, to the spindle motor and to the actuator for exchanging signals with the magnetic head assembly, for controlling movement of the magnetic disk and for controlling the position of the magnetic head assembly.

10. A magnetic disk drive as claimed in claim 9 wherein the free layer is located between pinned layer and the first pole piece layer.

11. A magnetic disk drive as claimed in claim 10 wherein the biasing layer includes:

a ferromagnetic pinned film interfacing the coupling layer and having a magnetic moment; and an antiferromagnetic pinning film exchange coupled to the pinned film for pinning the magnetic moment of the pinned film.

12. A magnetic disk drive as claimed in claim 11 wherein the coupling layer is selected from ruthenium (Ru) or tantalum (Ta).

13. A magnetic disk drive as claimed in claim 9 wherein the pinned layer is located between the free layer and the first pole piece layer.

14. A magnetic disk drive as claimed in claim 13 wherein the biasing layer includes:

a ferromagnetic pinned film interfacing the coupling layer and having a magnetic moment; and an antiferromagnetic pinning film exchange coupled to the pinned film for pinning the magnetic moment of the pinned film.

15. A magnetic disk drive as claimed in claim 14 wherein the coupling layer is selected from ruthenium (Ru) or tantalum (Ta).

16. A method of making a magnetic head assembly having an air bearing surface (ABS) comprising the steps of:

forming a tunnel junction sensor recessed from the ABS and including the steps of:

forming a ferromagnetic pinned layer with a magnetic moment;

forming an antiferromagnetic pinning layer exchange coupled to the pinned layer for pinning the magnetic moment of the pinned layer;

forming a free layer with a magnetic moment that is free to rotate in response to field signals from a rotating magnetic disk;

forming a nonmagnetic spacer layer between the free layer and the pinned layer;

forming a bias stack including:

forming a ferromagnetic biasing layer; and forming a metallic coupling layer between and interfacing said free layer and the biasing layer so that a magnetic moment of the free layer is longitudinally biased by edge magnetostatic force and/or antiparallel coupling from the biasing layer; and forming a flux guide which includes an extension of the bias stack and the free layer extending from the tunnel junction sensor to said ABS.

17. A method of making a magnetic head assembly as claimed in claim 16 further comprising the steps of:

forming a write head including the steps of forming ferromagnetic first and second pole piece layers that have a yoke portion located between a pole tip portion and a back gap portion;

forming a nonmagnetic write gap layer between the pole tip portions of the first and second pole piece layers;

forming an insulation stack with at least one coil layer embedded therein between the yoke portions of the first and second pole piece layers; and connecting the first and second pole piece layers at their back gap portions; and further forming the read head with a ferromagnetic first shield layer; and forming the tunnel junction sensor and the flux guide between the first shield layer and the first pole piece layer.

18. A method of making a magnetic head assembly as claimed in claim 17 wherein the free layer is further formed between the pinned layer and the first pole piece layer.

19. A method of making a magnetic head assembly as claimed in claim 18 wherein the forming of the biasing layer further includes the steps of:

forming a ferromagnetic pinned film interfacing the coupling layer and having a magnetic moment; and forming an antiferromagnetic pinning film exchange coupled to said pinned film for pinning the magnetic moment of said pinned film.

20. A method of making a magnetic head assembly as claimed in claim 19 wherein the coupling layer is formed from the group consisting of Ru, Ta and Ti.

21. A method of making a magnetic head assembly as claimed in claim 17 wherein the pinned layer is further formed between the free layer and the first pole piece layer.

22. A method of making a magnetic head assembly as claimed in claim 21 wherein the forming of the biasing layer further includes the steps of:

forming a ferromagnetic pinned film interfacing the coupling layer and having a magnetic moment; and forming an antiferromagnetic pinning film exchange coupled to said pinned film for pinning the magnetic moment of said pinned film.

23. A method of making a magnetic head assembly as claimed in claim 22 wherein the coupling layer is formed from Ru, Ta or Ti.

24. A method of making a magnetic read head which includes a read sensor and a flux guide and which has an air bearing surface (ABS) wherein the read sensor is recessed from the ABS and the flux guide extends from the read sensor to the ABS, comprising the steps of:

forming a ferromagnetic first shield layer;

forming sensor material layers including:

forming an antiferromagnetic pinning layer on the first shield layer;

forming a ferromagnetic pinned layer on the pinning layer so that a magnetic moment of the pinned layer is pinned by the pinning layer;

forming a nonmagnetic spacer layer on the pinned layer;

forming a ferromagnetic free layer on the spacer layer with a magnetic moment that is free to rotate in response to field signals from a rotating magnetic disk; and forming a first cap layer on the free layer at a top of the sensor material layers;

forming a first mask on the sensor material layers for defining a stripe height of the read sensor;

milling the layers to define said stripe height of the read sensor and backfilling with a first insulation layer;

removing the first mask;

removing the first cap layer to expose the free layer;

forming a flux guide on the free layer which extends from the free layer beyond a site for said ABS;

forming a bias stack on the flux guide and the first insulation layer which includes:
  forming a nonmagnetic coupling layer on the flux guide;
  forming a biasing layer on the coupling layer for longitudinally biasing a magnetic moment of the free layer and flux guide; and
  forming a nonmagnetic second cap layer on the biasing layer;

forming a second mask on the layers for defining a track width of the read sensor;

milling the layers to define said track width of the read sensor and backfilling with a second insulation layer;

removing the second mask;

forming a third mask on the layers for defining a back edge of the flux guide and bias stack;

milling the layers to define said back edge of the flux guide and the bias stack and backfilling with a third insulation layer;

lapping the layers to form the ABS and a front edge of the flux guide and the bias stack; and forming a second shield layer on the layers.

25. A method of making a magnetic read head which includes a read sensor and a flux guide and which has an air bearing surface (ABS) wherein the read sensor is recessed from the ABS and the flux guide extends from the read sensor to the ABS, comprising the steps of:

forming a ferromagnetic first shield layer;

forming a bias stack on the first shield layer including the steps of:
  forming a biasing layer on the first shield layer; and
  forming a nonmagnetic coupling layer on the biasing layer;

forming a read sensor comprising the steps of:
  forming a free layer on the coupling layer so that the biasing layer longitudinally biases the first free layer;
  forming a nonmagnetic spacer layer on the free layer;
  forming a ferromagnetic pinned layer on the spacer layer with a magnetic moment;
  forming an antiferromagnetic pinning layer on the pinned layer for pinning the magnetic moment of the pinned layer; and
  forming a cap layer on the pinning layer;

forming a first mask on the layers for forming a back edge of the bias stack and the free layer;

ion milling the layers to define said back edge of the flux guide bias stack and the free layer and back filling with a first insulation layer;

removing the first mask;

forming a second mask on the layers for defining a track width of the read sensor;

milling the layers to define said track width of the read sensor and back filling with a second insulation layer;

forming a third mask on the layers for defining a stripe height of the read sensor which is recessed from a site of said ABS;

milling the layers to define said stripe height of the read sensor;

lapping the layers to define said ABS and a front edge of the bias stack and the free layer; and forming a second shield layer on the layers.

* * * * *